United States Patent
Chang

(10) Patent No.: US 9,866,413 B2
(45) Date of Patent: Jan. 9, 2018

(54) TRANSITION ENFORCING CODING RECEIVER FOR SAMPLING VECTOR SIGNALS WITHOUT USING CLOCK AND DATA RECOVERY

(71) Applicant: MEDIATEK INC., Hsin-Chu (TW)

(72) Inventor: Ching-Hsiang Chang, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/407,265

(22) Filed: Jan. 17, 2017

(65) Prior Publication Data

US 2017/0126444 A1  May 4, 2017

Related U.S. Application Data

(63) Continuation-in-part of application No. 15/005,016, filed on Jan. 25, 2016.

(60) Provisional application No. 62/421,375, filed on Nov. 14, 2016, provisional application No. 62/108,626, filed on Jan. 28, 2015.

(51) Int. Cl.
  *H04L 25/493*  (2006.01)
(52) U.S. Cl.
  CPC .................. *H04L 25/493* (2013.01)
(58) Field of Classification Search
  USPC .................. 375/293; 370/419, 359
  See application file for complete search history.

(56) References Cited

U.S. PATENT DOCUMENTS

| 6,763,477 | B1 | 7/2004 | McGee |
| 7,126,408 | B2 | 10/2006 | Zerbe |
| 7,301,996 | B1 | 11/2007 | Chi |
| 8,718,184 | B1 | 5/2014 | Cronie |
| 2009/0027093 | A1* | 1/2009 | Chen ...................... G11C 7/222 327/158 |
| 2011/0029803 | A1 | 2/2011 | Redman-White |
| 2011/0084863 | A1* | 4/2011 | Chiu ..................... G04F 10/005 341/141 |
| 2013/0268814 | A1 | 10/2013 | Choi |
| 2014/0270026 | A1 | 9/2014 | Sengoku |
| 2014/0286466 | A1 | 9/2014 | Sengoku |
| 2016/0359500 | A1* | 12/2016 | Lesso ...................... H03M 1/18 |
| 2017/0097655 | A1* | 4/2017 | Jeon ......................... G06F 1/12 |

FOREIGN PATENT DOCUMENTS

EP    3 051 424 A1    8/2016

* cited by examiner

*Primary Examiner* — Eva Puente
(74) *Attorney, Agent, or Firm* — Winston Hsu

(57) ABSTRACT

A transition enforcing coding (TEC) receiver includes a delay line circuit, a transition detection circuit, a data sampling circuit, and a skew calibration circuit. The delay line circuit employs a calibrated delay setting to delay a plurality of vector signals to generate a plurality of delayed vector signals under a normal mode, respectively. The transition detection circuit detects a transition of at least one specific delayed vector signal among the delayed vector signals. The data sampling circuit samples the vector signals according to a sampling timing, wherein the sampling timing is determined based on an output of the transition detection circuit. The skew calibration circuit sets the calibrated delay setting under a calibration mode, wherein transition skew between different delayed vector signals is reduced by the calibrated delay setting under the normal mode.

20 Claims, 35 Drawing Sheets

TRANSITION ENFORCING CODING RECEIVER FOR SAMPLING VECTOR SIGNALS WITHOUT USING CLOCK AND DATA RECOVERY

CROSS REFERENCE TO RELATED APPLICATION

This is a continuation-in-part of U.S. application Ser. No. 15/005,016 filed Jan. 25, 2016, and claims the benefit of U.S. provisional application No. 62/421,375 filed Nov. 14, 2016, where U.S. application Ser. No. 15/005,016 claims the benefit of U.S. provisional application No. 62/108,626 filed Jan. 28, 2015. The entire contents of these related applications are incorporated herein by reference.

BACKGROUND

The disclosed embodiments of the present invention relate to data recovery at a receiver, and more particularly, to a transition enforcing coding (TEC) receiver for sampling vector signals without using clock and data recovery (CDR).

Transition enforcing coding (TEC) is a technique used to convert a bit sequence into a plurality of vector signals for transmission and reception between different chips. The TEC makes transition(s) always happen between adjacent states of the vector signals. For example, the vector signals records data bits representative of a current state during a current transmission clock cycle, and records data bits representative of a next state during a next transmission clock cycle, where the data bits representative of the current state and the data bits representative of the next state have at least one bit inversion (e.g., 1→0 or 0→1). The conventional TEC receiver generally has a clock and data recovery (CDR) circuit implemented therein. The CDR circuit is used to adjust the sampling timing for allowing a data sampler to get an optimal setup/hold time margin to sample the received vector signals correctly. However, the CDR circuit will lead to a larger chip area as well as higher power consumption, and will require an extra lock-in time for ensuring correct data sampling. Further, if the TEC transmitter needs to cover a wide range of data rates, the CDR circuit in the TEC receiver needs to be implemented using a wide-range CDR circuit, which results in a higher production cost.

Thus, there is a need for an innovative TEC receiver which is capable of correctly sampling the received vector signals without using any CDR circuit.

SUMMARY

In accordance with exemplary embodiments of the present invention, a transition enforcing coding (TEC) receiver for sampling vector signals without using clock and data recovery (CDR) is proposed.

According to a first aspect, an exemplary transition enforcing coding (TEC) receiver is disclosed. The TEC receiver comprises a delay line circuit, a transition detection circuit, a data sampling circuit, and a skew calibration circuit. The delay line circuit is configured to employ a calibrated delay setting to delay a plurality of vector signals to generate a plurality of delayed vector signals under a normal mode, respectively. The transition detection circuit is configured to detect a transition of at least one specific delayed vector signal among the delayed vector signals. The data sampling circuit is configured to sample the vector signals according to a sampling timing, wherein the sampling timing is determined based on an output of the transition detection circuit. The skew calibration circuit is configured to set the calibrated delay setting under a calibration mode, wherein transition skew between different delayed vector signals is reduced by the calibrated delay setting under the normal mode.

According to a second aspect of the present invention, an exemplary receiving method applied to transition enforcing coding (TEC) is disclosed. The exemplary receiving method includes: performing skew calibration to set a calibrated delay setting under a calibration mode; delaying a plurality of vector signals according to the calibrated delay setting to generate a plurality of delayed vector signals under a normal mode, respectively, wherein transition skew between different delayed vector signals is reduced by the calibrated delay setting under the normal mode; detecting a transition of at least one specific delayed vector signal among the delayed vector signals to generate a transition detection output; and sampling the vector signals according to a sampling timing, wherein the sampling timing is determined based on the transition detection output.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
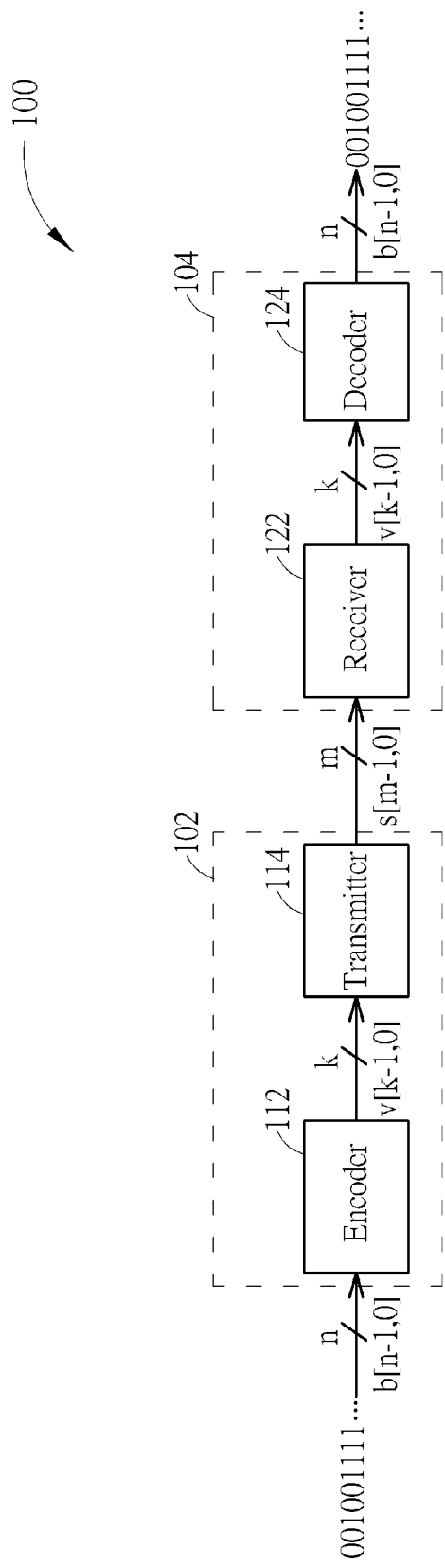
FIG. 1 is a diagram illustrating a communication system according to an embodiment of the present invention.

FIG. 1 is a diagram illustrating a communication system according to an embodiment of the present invention. The communication system 100 includes an encoder 112 and a transmitter 114 located at a first chip 102, and further includes a receiver 122 and a decoder 124 located at a second chip 104. An n-bit binary data b[n-1,0] can be encoded into k vector signals v [k-1, 0] by the encoder 112 according to an employed transition enforcing coding (TEC) algorithm. The transmitter 114 has a serializer (not shown) to convert the k vector signals v[k-1,0] into m vector signals s [m-1,0] for high speed data transmission, and then transmits the m vector signals s [m-1,0] from the first chip 102 to the second chip 104 via m parallel channels. The receiver 122 receives the m vector signals s [m-1, 0] from m parallel channels, and has a deserializer (not shown) to convert sampled data of the received m vector signals s [m-1, 0] into sampled data of k vector signals v[k-1,0]. The decoder 124 can decode the k vector signals v[k-1,0] to recover the n-bit binary data b[n-1,0] according to the employed TEC algorithm. In this embodiment, the receiver 122 employs a proposed TEC receiver structure to generate the sampled data of the m vector signals s [m-1, 0] without using a conventional CDR circuit. Further details of the proposed TEC receiver structure are described as below.

Figure 2:
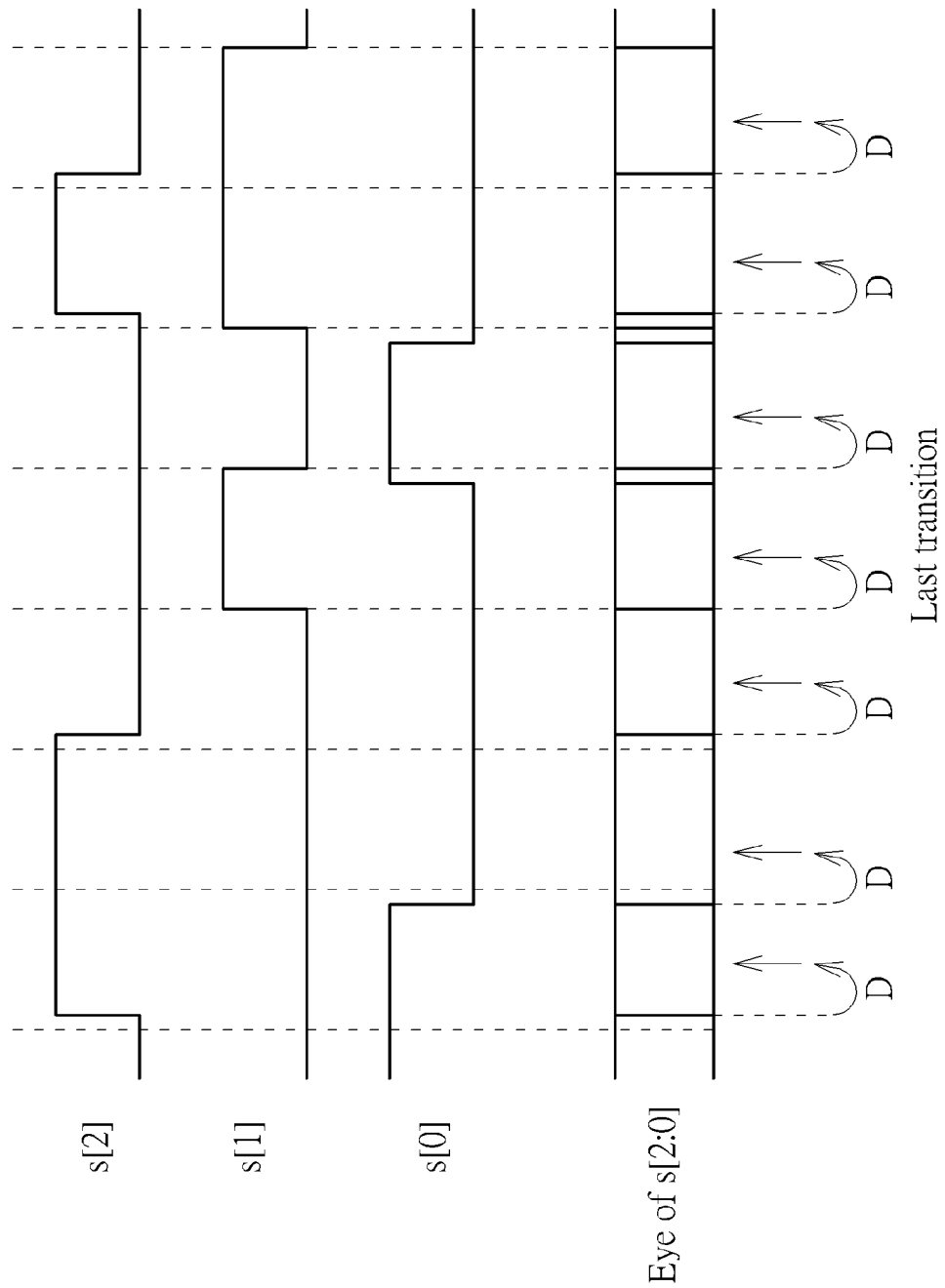
FIG. 2 is a diagram illustrating a first concept of sampling vector signals without using a conventional CDR circuit according to an embodiment of the present invention.

FIG. 2 is a diagram illustrating a first concept of sampling vector signals without using a conventional CDR circuit according to an embodiment of the present invention. Supposing that m=3, three vector signals s [2], s [1] and s [0] are received by a TEC receiver from parallel channels, respectively. As mentioned above, the TEC makes at least one transition always happen between adjacent states of the vector signals. The last transition between the adjacent states (e.g., around an edge of one transmission clock cycle) can be detected. If there is only one transition occurring between adjacent states of the vector signals, this detected transition is regarded as the last transition. If there are multiple transitions occurring between adjacent states of the vector signals, one of the detected transitions that has the last occurrence time is regarded as the last transition. The timing of the detected last transition can be delayed by one predetermined delay time D to be one sampling timing of the vector signals s [2], s [1] and s [0]. As can be seen from the eye diagram of the vector signals s [2], s [1] and s [0], the signal level from the last transition between a current state transition to the first transition between a next state transition is stable and clean. With a proper setting of the predetermined delay time D, the predetermined delay time D can be enough for the setup/hold time margin of a data sampling operation. Hence, data bits representative of one state of the vector signals s [2], s [1] and s [0] can be correctly recovered by the sampling timing determined directly based on a delayed version of the last transition detected between adjacent states.

Figure 3:
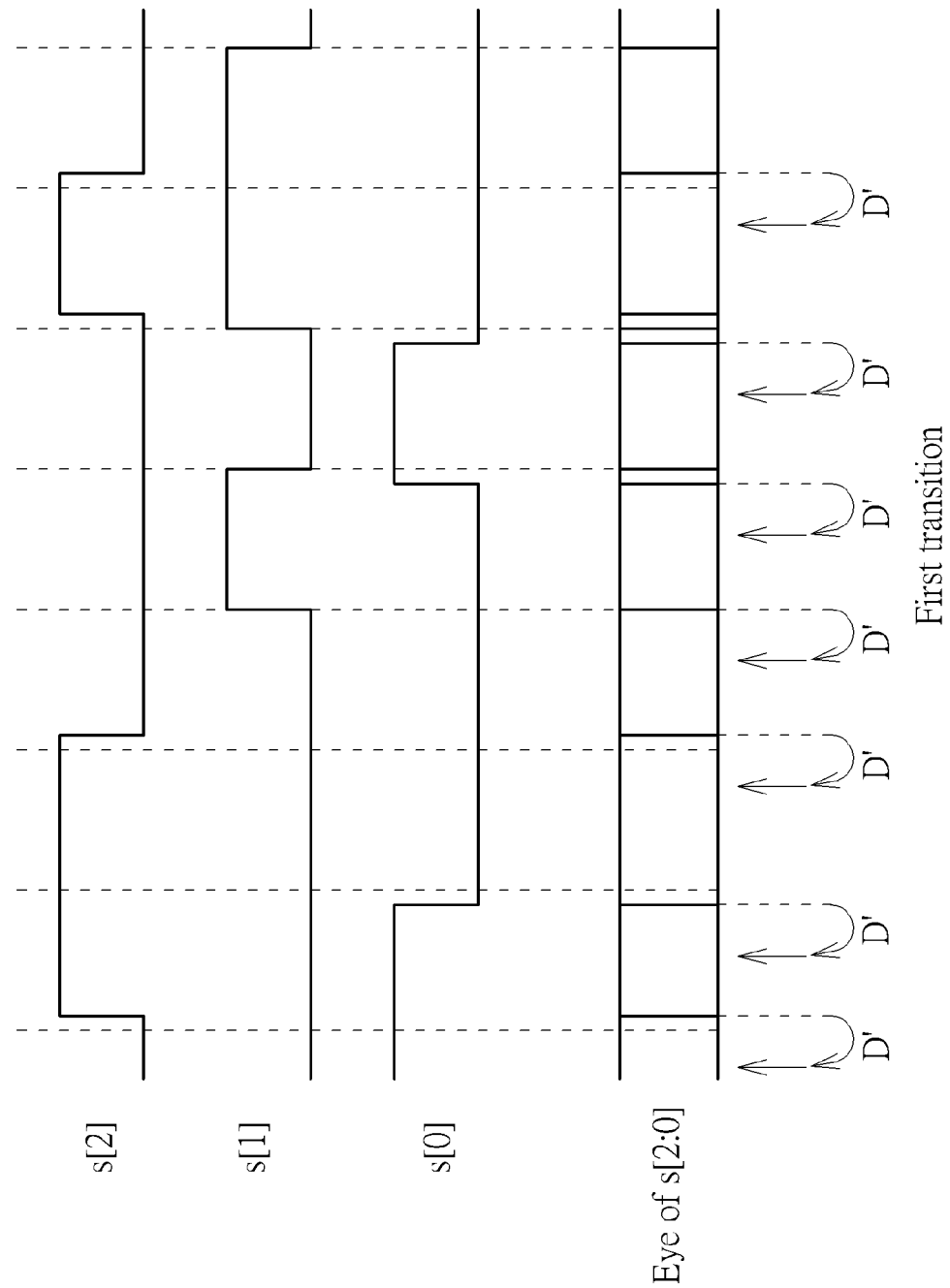
FIG. 3 is a diagram illustrating a second concept of sampling vector signals without using a conventional CDR circuit according to an embodiment of the present invention.

FIG. 3 is a diagram illustrating a second concept of sampling vector signals without using a conventional CDR circuit according to an embodiment of the present invention. Supposing that m=3, three vector signals s [2], s [1] and s [0] are received by a TEC receiver from parallel channels, respectively. As mentioned above, the TEC makes at least one transition always happen between adjacent states of the vector signals. The first transition between the adjacent states (e.g., around an edge of one transmission clock cycle) can be detected. If there is only one transition occurring between adjacent states of the vector signals, this detected transition is regarded as the first transition. If there are multiple transitions occurring between adjacent states of the vector signals, one of the detected transitions that has the first occurrence time is regarded as the first transition. The timing of the detected first transition can be advanced by one predetermined advance time D' to be one sampling timing of the vector signals s [2], s [1] and s [0]. As can be seen from the eye diagram of the vector signals s [2], s [1] and s [0], the signal level from the first transition between a current state transition to the last transition between a previous state transition is stable and clean. With a proper setting of the predetermined advance time D', the predetermined advance time D' can be enough for the setup/hold time margin of a data sampling operation. Hence, data bits representative of one state of the vector signals s [2], s [1] and s [0] can be correctly recovered by the sampling timing determined directly based on an advanced version of the first transition detected between adjacent states.

The proposed TEC receiver can be configured on the basis of one of the aforementioned concepts shown in FIG. 2 and FIG. 3 to achieve the objective of recovering/sampling correct data without using a conventional CDR circuit. Several exemplary designs of the TEC receiver are discussed as below.

Figure 4:
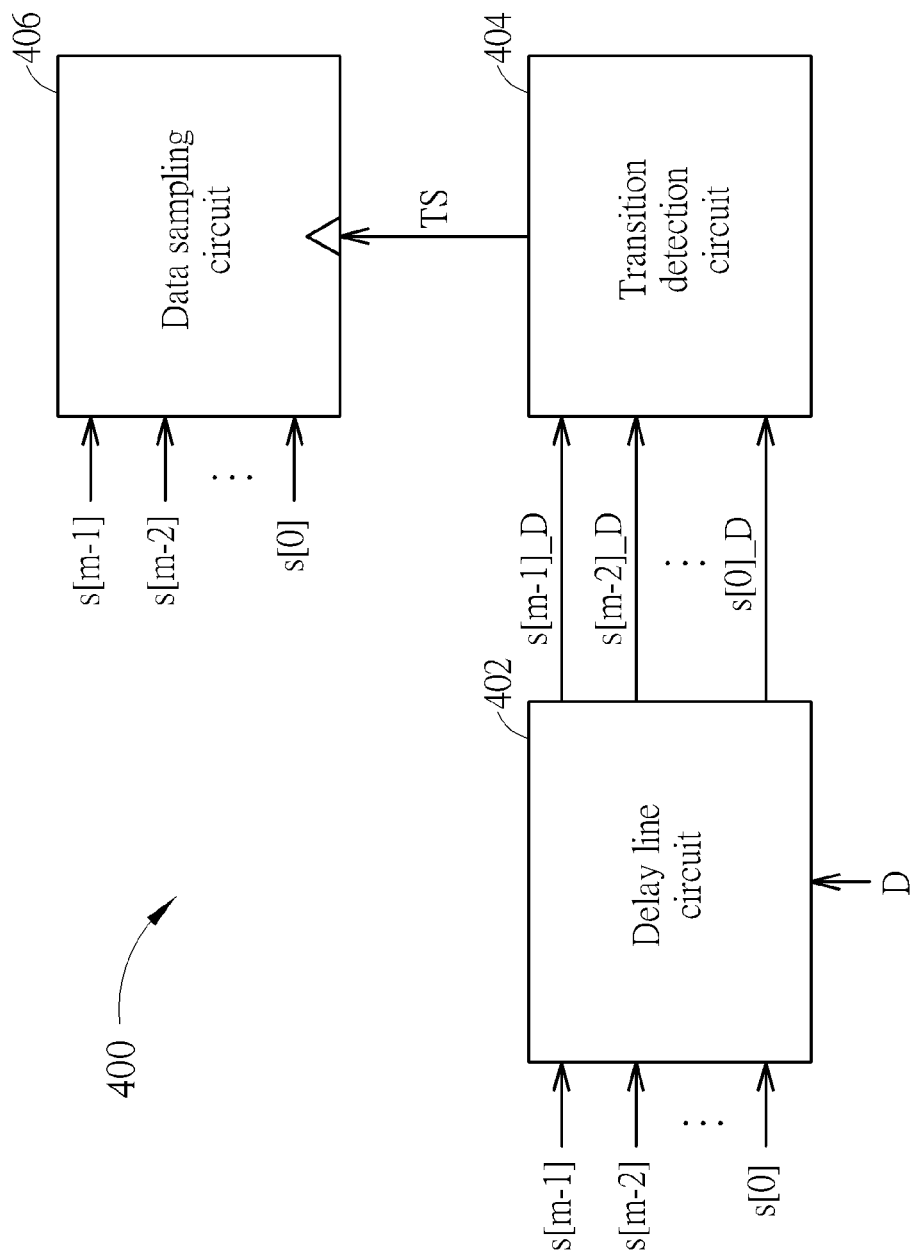
FIG. 4 is a diagram illustrating a TEC receiver according to a first embodiment of the present invention.

FIG. 4 is a diagram illustrating a TEC receiver according to a first embodiment of the present invention. The receiver 122 shown in FIG. 1 may be implemented using the TEC receiver 400 shown in FIG. 4. The TEC receiver 400 includes a delay line circuit 402, a transition detection circuit 404, and a data sampling circuit 406. It should be noted that only the circuit components pertinent to the present invention are shown in FIG. 4. In practice, the TEC receiver 400 may include additional circuit components. For example, the TEC receiver 400 may have at least one deserializer used to further process an output of the data sampling circuit 406.

The delay line circuit 402 is arranged to delay a plurality of vector signals (e.g., m vector signals s [m-1]-s [0]) to generate a plurality of delayed vector signals (e.g. , m delayed vector signals s [m-1]_D-s [0]_D), respectively. It should be noted that the delay time D applied to each of the vector signals s [m-1]-s [0] should be enough for a setup/hold time margin of the data sampling circuit 406. In one exemplary design, the same delay time D with a proper setting may be applied to all vector signals. In another exemplary design, different delay times D may be applied to different vector signals for ensuring enough setup/hold time margins for sampling the different vector signals and reducing transition skew between different delayed vector signals (i.e., aligning transition(s) between adjacent states of the different delayed vector signals).

The transition detection circuit 404 is arranged to detect a transition of at least one specific delayed vector signal among the delayed vector signals s [m-1]_D-s [0]_D. In this embodiment, the transition of the at least one specific delayed vector signal is the last transition detected between adjacent states of the delayed vector signals s [m-1]_D-s [0]_D. It should be noted that the delayed vector signals s [m-1]_D-s [0]_D and the vector signals s [m-1]-s [0] deliver the same data bits but are time-shifted by the delay time D. The data sampling circuit 406 is arranged to sample the vector signals s [m-1]-s [0] according to a sampling timing TS determined based on an output of the transition detection circuit 404. In this embodiment, the TEC receiver 400 determines the sampling timing TS without using clock and data recovery (CDR). For example, the sampling timing TS is directly set by the timing of the transition of the at least one specific delayed vector signal (i.e., timing of the last transition detected between adjacent states).

As mentioned above, the delay line circuit 402 is arranged to delay the vector signals s [m-1]-s [0] for generating delayed vector signals s [m-1]_D-s [0]_D, where the delayed vector signals s [m-1]_D-s [0]_D are used by the transition detection circuit 404 to detect a transition of at least one specific delayed vector signal. Since the delay line circuit 402 is located before the transition detection circuit 404, it is possible to overcome the skew issue among the vector signals s [m-1]-s [0] with certain calibration pattern. Hence, in addition to acting as a delayed vector signal generator, the delay line circuit 402 may be further configured to act as a de-skew circuit for aligning transition(s) between adjacent states of the vector signals s [m-1]-s [0]. In this way, the vector signals s [m-1]-s [0] are de-skewed and delayed by the same delay line circuit 402.

Figure 5:
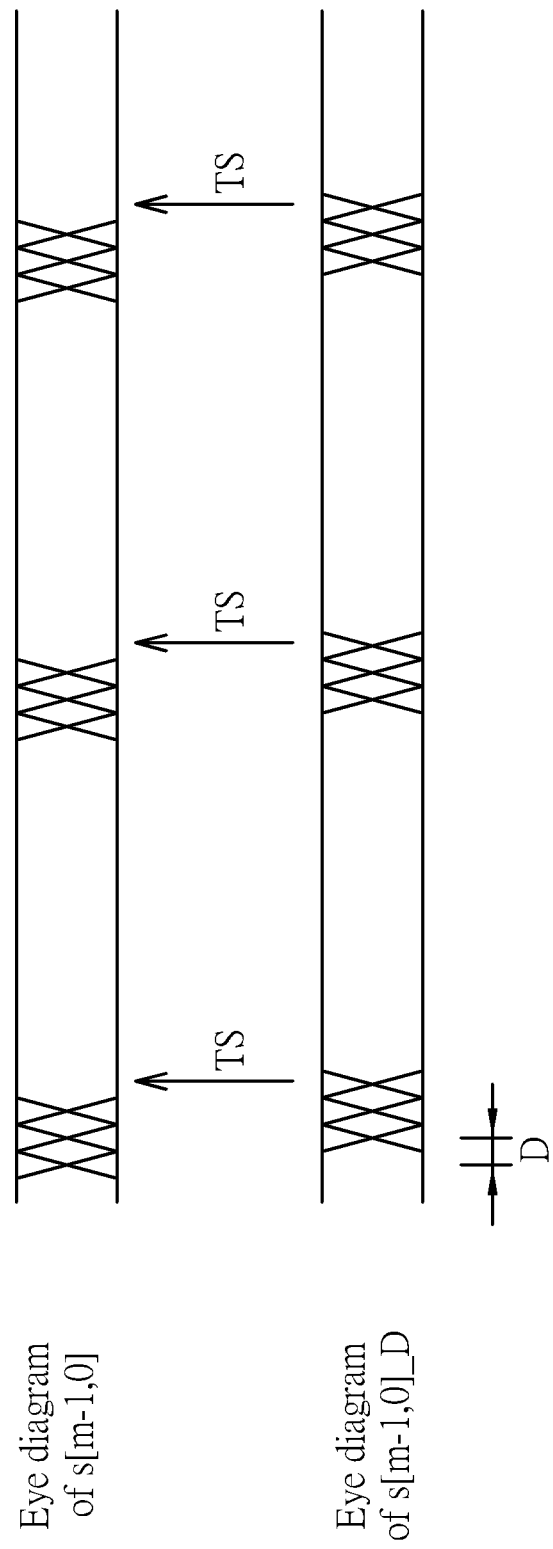
FIG. 5 is a diagram illustrating an example of a data sampling operation performed by the TEC receiver shown in FIG. 4.

FIG. 5 is a diagram illustrating an example of a data sampling operation performed by the TEC receiver 400 shown in FIG. 4. The TEC receiver 400 may be configured on the basis of the concept shown in FIG. 2. The delayed vector signals s [m-1]_D-s [0]_D are checked by the transition detection circuit 404 to find the last transition between adjacent states. The timing of the last transition possessed by at least one of the delayed vector signals s [m-1]_D-s [0]_D is equivalent to a delayed version of the timing of the last transition possessed by at least one of the vector signals s [m-1]-s [0]. Hence, the timing of the last transition possessed by at least one of the delayed vector signals s [m-1]_D-s [0]_D can be directly used as the sampling timing TS of the data sampling circuit 406 for getting sampled data from the vector signals s [m-1]-s [0].

Figure 6:
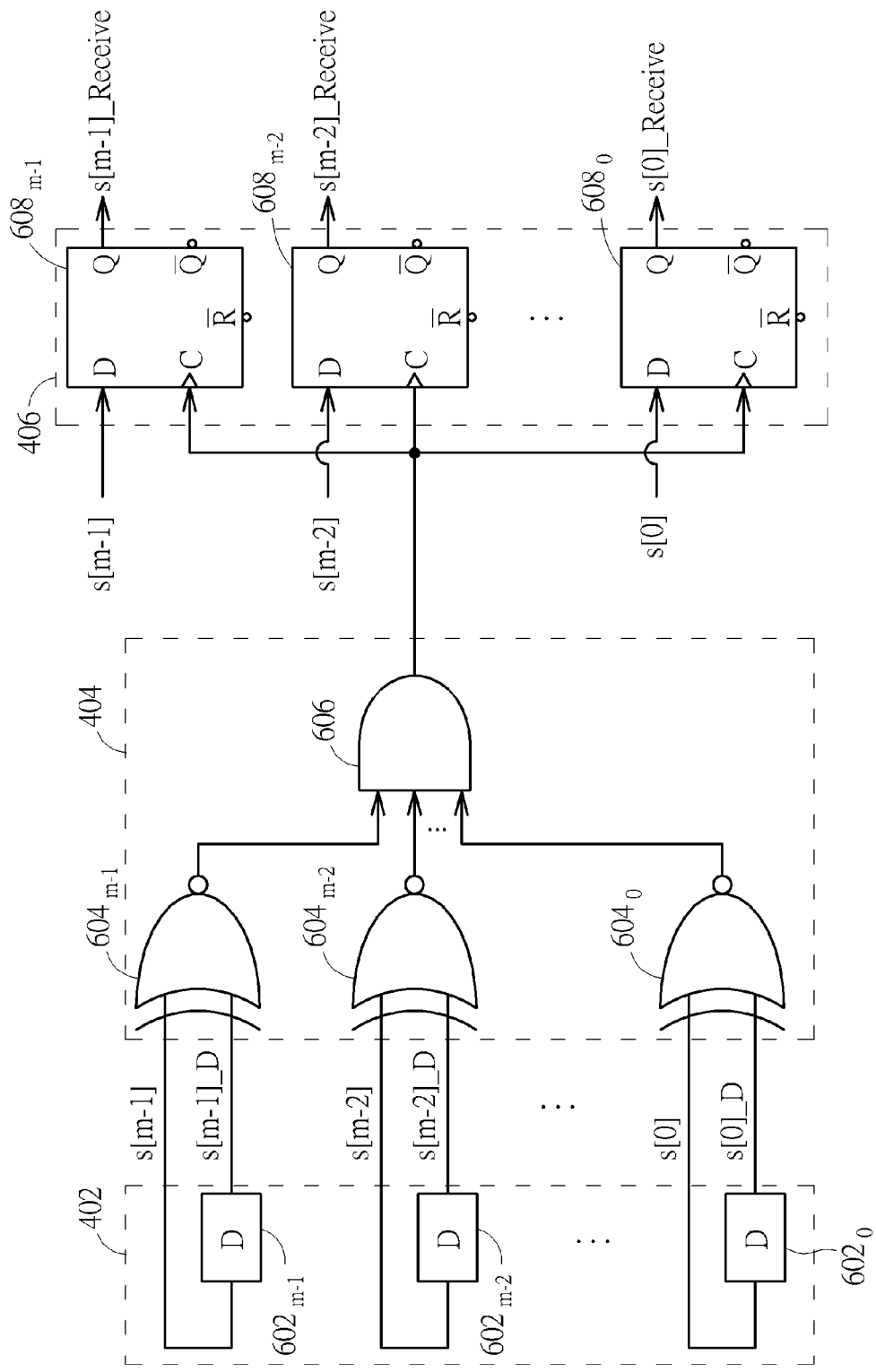
FIG. 6 is a diagram illustrating one circuit implementation of the TEC receiver shown in FIG. 4 according to an embodiment of the present invention.

FIG. 6 is a diagram illustrating one circuit implementation of the TEC receiver 400 shown in FIG. 4 according to an embodiment of the present invention. As shown in FIG. 6, the delay line circuit 402 includes a plurality of delay lines (denoted by "D") $602_0$-$602_{m-1}$ used for generating the delayed vector signals s [0]_D-s [m-1]_D according to the vector signals s [0]-s [m-1], respectively. The delay time settings employed by the delay lines $602_0$-$602_{m-1}$ may be same or different, depending upon actual design considerations. In this exemplary circuit design, the vector signals s [0]-s [m-1] are supplied to the data sapling circuit 406 as well as the transition detection circuit 404. Hence, besides the delayed vector signals s [0]_D-s [m-1]_D, the vector signals s [0]-s [m-1] are involved in the last transition detection.

The transition detection circuit 404 includes a plurality of logic gates (e.g., exclusive NOR (XNOR) gates) $604_0$-$604_{m-1}$ and one logic gate (e.g., AND gate) 606. In accordance with the logic operations performed by the logic gates $604_0$-$604_{m-1}$ and 606, the output of the transition detection circuit 404 (particularly, the output of the logic gate 606) has a rising edge at the last transition detected between adjacent states of the delayed vector signals s [0]_D-s [m-1]_D. The data sampling circuit 406 includes a plurality of data samplers $608_0$-$608_{m-1}$ implemented using D-type flip flips (DFFs). The data samplers $608_0$-$608_{m-1}$ are clocked by the same rising edge of the output of the transition detection circuit 404 to sample the vector signals s [0]-s [m-1] at the same time, thereby generating sampled data bits s [0]_Receive-s [m-1]_Receive, respectively.

Figure 7:
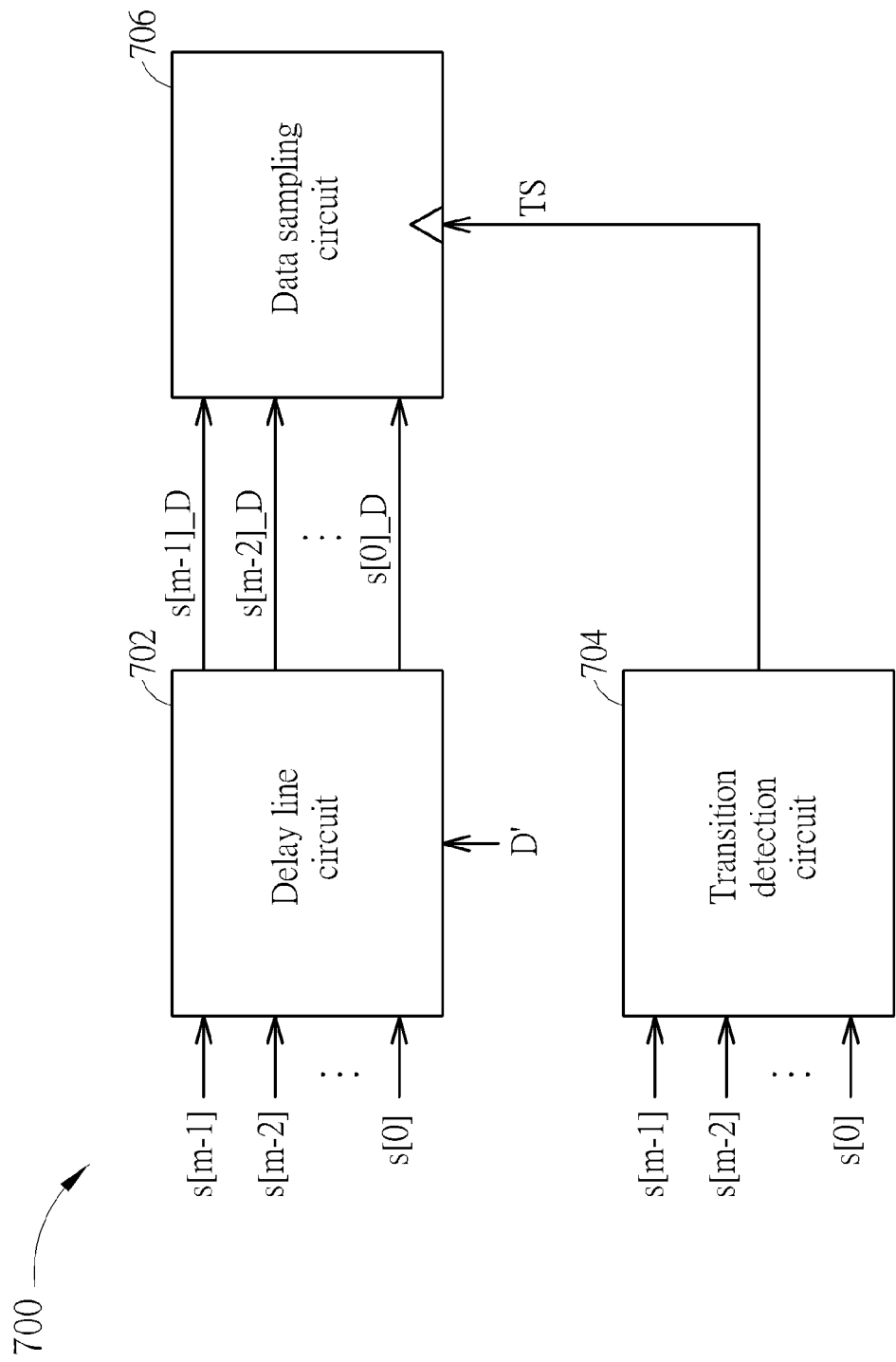
FIG. 7 is a diagram illustrating a TEC receiver according to a second embodiment of the present invention.

FIG. 7 is a diagram illustrating a TEC receiver according to a second embodiment of the present invention. The receiver 122 shown in FIG. 1 may be implemented using the TEC receiver 700 shown in FIG. 7. The TEC receiver 700 includes a delay line circuit 702, a transition detection circuit 704, and a data sampling circuit 706. It should be noted that only the circuit components pertinent to the present invention are shown in FIG. 6. In practice, the TEC receiver 700 may include additional circuit components. For example, the TEC receiver 700 may have at least one deserializer used to further process an output of the data sampling circuit 706.

The delay line circuit 702 is arranged to delay a plurality of vector signals (e.g., m vector signals s [m-1]-s [0]) to generate a plurality of delayed vector signals (e.g., m delayed vector signals s [m-1]_D-s [0]_D), respectively. It should be noted that the delay time D' should be enough for a setup/hold time margin of the data sampling circuit 406. In one exemplary design, the same delay time D' with a proper setting may be applied to all vector signals. In another exemplary design, different delay times D' may be applied to different vector signals for ensuring enough setup/hold time margins for sampling the different vector signals and reducing transition skew between different delayed vector signals.

The transition detection circuit 704 is arranged to detect a transition of at least one specific vector signal among the vector signals s [m-1]-s [0]. In this embodiment, the transition of the at least one specific vector signal is the first transition detected between adjacent states of the vector signals s [m-1]-s [0]. The data sampling circuit 706 is arranged to sample the delayed vector signals s [m-1]_D-s [0]_D according to a sampling timing TS determined based on an output of the transition detection circuit 704. In this embodiment, the TEC receiver 700 determines the sampling timing TS without using clock and data recovery (CDR). For example, the sampling timing TS is directly set by the timing of the transition of the at least one specific vector signal (i.e., timing of the first transition detected between adjacent states).

Figure 8:
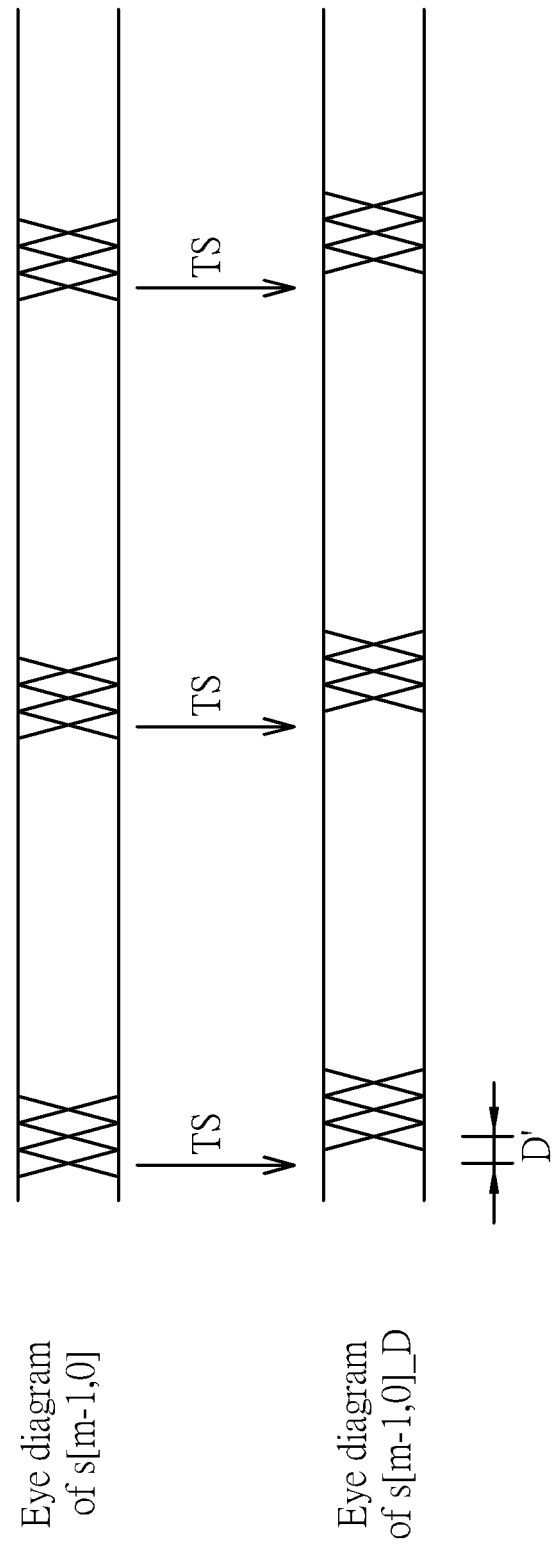
FIG. 8 is a diagram illustrating an example of a data sampling operation performed by the TEC receiver shown in FIG. 7.

FIG. 8 is a diagram illustrating an example of a data sampling operation performed by the TEC receiver 700 shown in FIG. 7. The TEC receiver 700 may be configured on the basis of the concept shown in FIG. 3. The vector signals s [m-1]-s [0] are checked by the transition detection circuit 704 to find the first transition between adjacent states. Since the vector signals s [m-1]-s [0] are delayed for following data sampling at the data sampling circuit 706, the timing of the first transition possessed by one of the vector signals s [m-1]-s [0] that is referenced for sampling the delayed vector signals s [m-1]_D-s [0]_D is equivalent to an advanced version of the timing of the first transition possessed by one of the vector signals s [m-1]-s [0] that is referenced for sampling the vector signals s [m-1]-s [0]. Hence, the timing of the first transition possessed by at least one of the vector signals s [m-1]-s [0] can be directly used as the sampling timing TS of the data sampling circuit 406 for getting sampled data from the delayed vector signals s [m-1]_D-s [0]_D, where the delayed vector signals s [m-1]_D-s [0]_D is a delayed version of the vector signals s [m-1]-s [0], and therefore have the same data bits transmitted via the vector signals s [m-1]-s [0].

Figure 9:
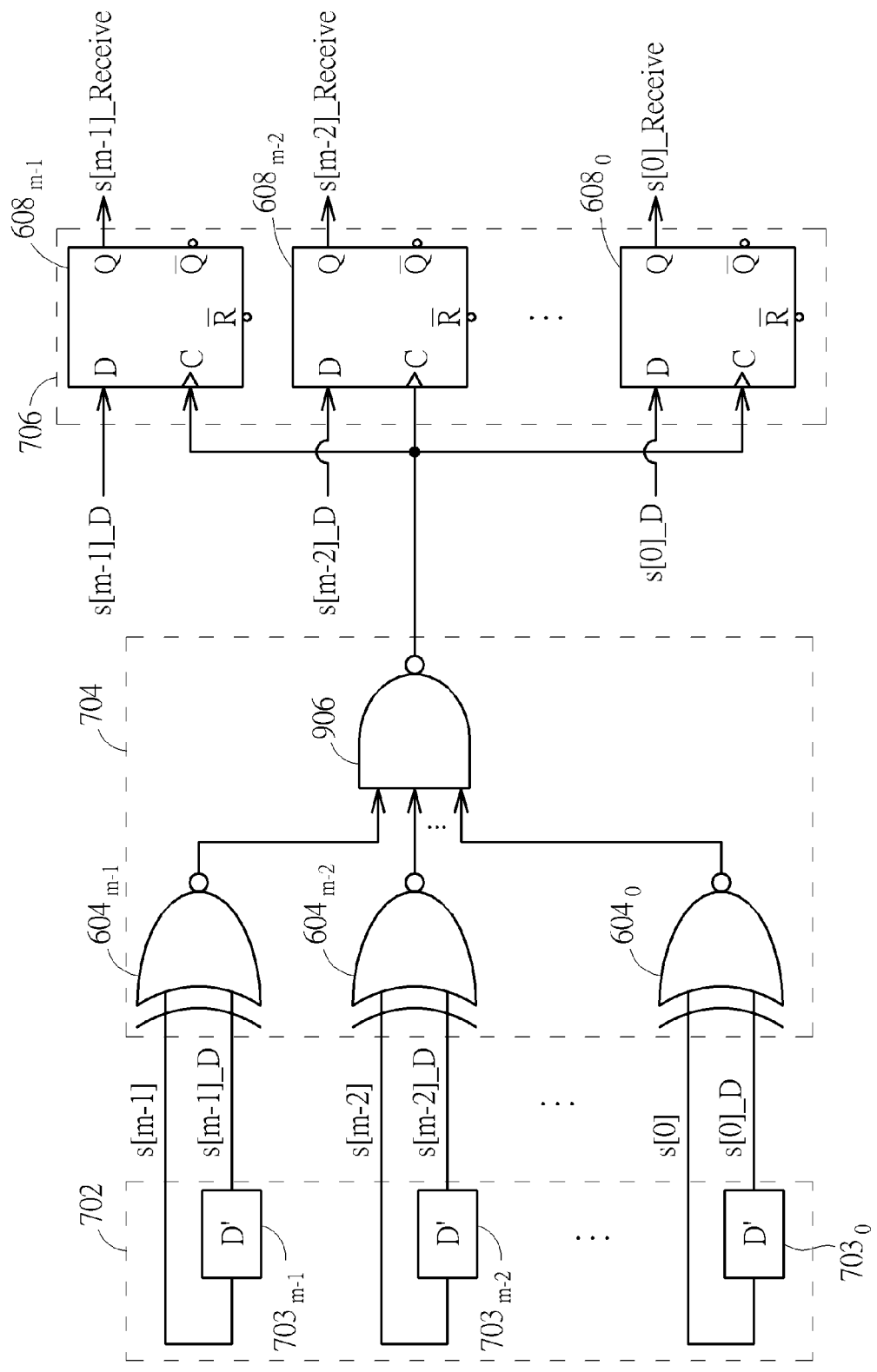
FIG. 9 is a diagram illustrating one circuit implementation of the TEC receiver shown in FIG. 7 according to an embodiment of the present invention.

FIG. 9 is a diagram illustrating one circuit implementation of the TEC receiver 700 shown in FIG. 7 according to an embodiment of the present invention. As shown in FIG. 9, the delay line circuit 702 includes a plurality of delay lines (denoted by "D") $703_0$-$703_{m-1}$ used for generating the delayed vector signals s [0]_D-s [m-1]_D according to the vector signals s [0]-s [m-1], respectively. It should be noted that the delay time settings employed by the delay lines $703_0$-$703_{m-1}$ may be same or different, depending upon actual design considerations. The delayed vector signals s [0]_D-s [m-1]_D are supplied to the data sampling circuit 706 as well as the transition detection circuit 704. Hence, besides the vector signals s [0]-s [m-1], the delayed vector signals s [0]_D-s [m-1]_D are involved in the first transition detection.

The transition detection circuit 704 includes logic gates (e.g., XNOR gates) $604_0$-$604_{m-1}$ and one logic gate (e.g., NAND gate) 906. In accordance with the logic operations performed by the logic gates $604_0$-$604_{m-1}$ and 906, the output of the transition detection circuit 704 (particularly, the output of the logic gate 906) has a rising edge at the first transition detected between adjacent states of the vector signals s [0]-s [m-1]. The data sampling circuit 706 includes a plurality of data samplers $608_0$-$608_{m-1}$ implemented using DFFs. The data samplers $608_0$-$608_{m-1}$ are clocked by the same rising edge of the output of the transition detection circuit 704 to sample the vector signals s [0]-s [m-1] at the same time, thereby generating sampled data bits s [0]_Receive-s [m-1]_Receive, respectively.

As shown in each of FIG. 6 and FIG. 9, the logic gate 606/906 is responsible for driving clock input nodes of all data samplers $608_0$-$608_{m-1}$. The pulse width is short when the data rate is high. In a case when the data samplers $608_0$-$608_{m-1}$ are operated in a full-rate clock domain, the logic gate 606/906 may have difficulty in doing the task of driving clock input nodes of all data samplers $608_0$-$608_{m-1}$ in a short time, and/or may consume large power to accomplish the task of driving clock input nodes of all data samplers $608_0$-$608_{m-1}$ in a short time. To relax the driving requirement of the logic gate 606/906, the present invention proposes a power-efficient TEC receiver design with clock generation and associated deserialization (e.g., 1-to-2 deserialization).

Figure 10:
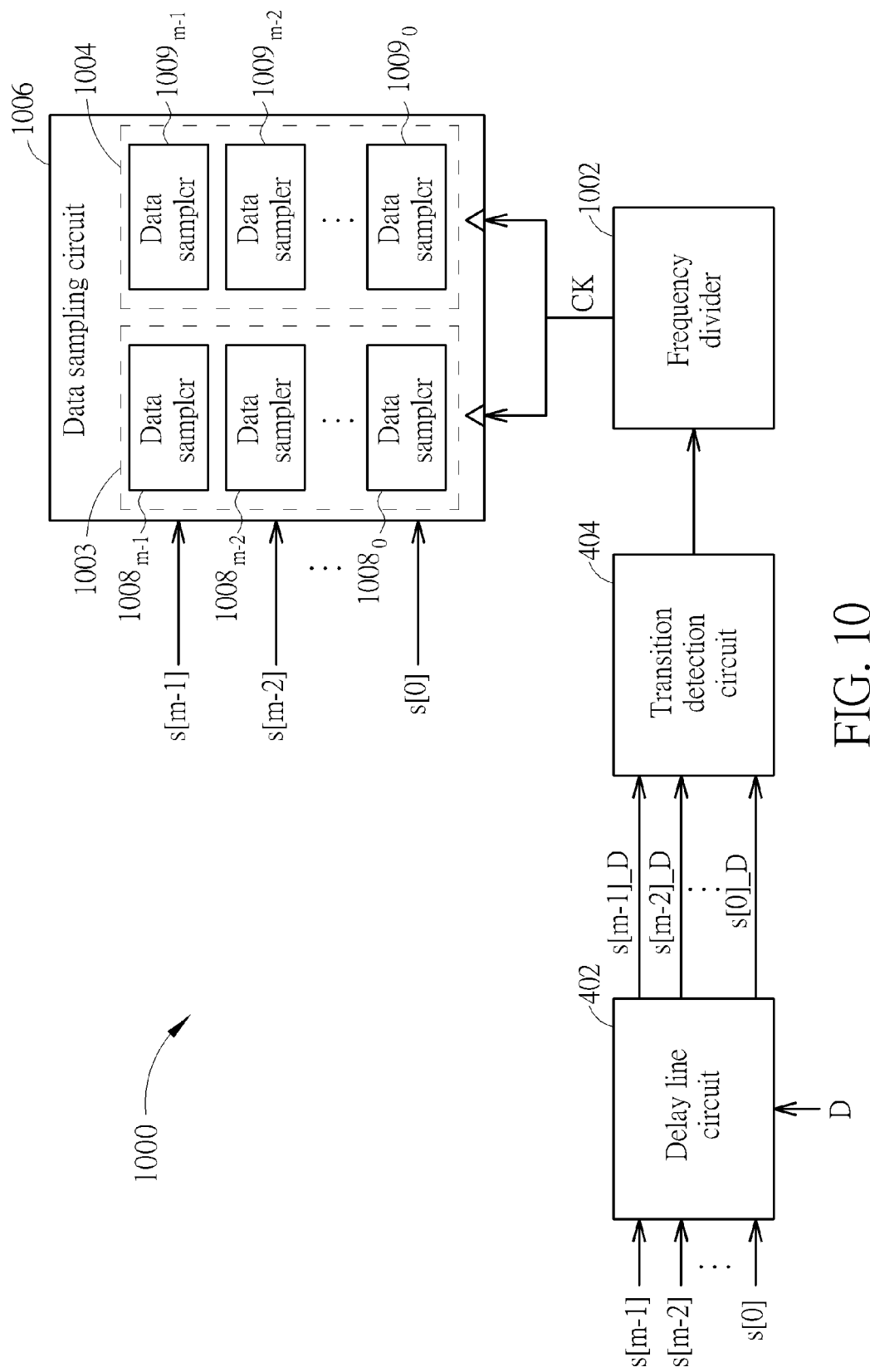
FIG. 10 is a diagram illustrating a TEC receiver according to a third embodiment of the present invention.

FIG. 10 is a diagram illustrating a TEC receiver according to a third embodiment of the present invention. The major difference between the TEC receivers 400 and 1000 is that the TEC receiver 1000 further has a frequency divider 1002 configured to drive the data sampling circuit 1006 with a plurality of data sampler groups (e.g., a first data sampler group 1003 and a second data sampler group 1004). In this embodiment, the first data sampler group 1003 is composed of a plurality of data samples $1008_0$-$1008_{m-1}$, and the second data sampler group 1004 is composed of a plurality of data samples $1009_0$-$1009_{m-1}$. The frequency divider 1002 is arranged to perform frequency division upon the output of the transition detection circuit 404 to generate a clock signal CK to the data sampling circuit 1006. For example, the frequency divider 1002 may be implemented using a divide-by-2 counter, such that an input of the frequency divider 1002 may be operated in a full-rate clock domain and an output of the frequency divider 1002 may be operated in a half-rate clock domain. Though the pulse width of the output of the transition detection circuit 404 is short, the duty cycle of the clock signal CK may be equal to or close to 50% due to inherent characteristics of the divide-by-2 counter. In this embodiment, the first data sampler group 1003 may be designed to be clocked by a rising edge of the clock signal CK, and the second data sampler group 1004 may be designed to be clocked by a falling edge of the clock signal CK. Hence, the data samplers $1008_0$-$1008_{m-1}$ are arranged to sample the vector signals s [0]-s [m-1] according to the rising edge of the clock signal CK, respectively; and the data samplers $1009_0$-$1009_{m-1}$ are arranged to sample the vector signals s [0]-s [m-1] according to the falling edge of the clock signal CK, respectively.

Compared to the output of the transition detection circuit 404, the clock signal CK has a lower clock rate and a longer logic-high/logic-low width. The frequency divider 1002 is used to drive the data sampling circuit 1006 on behalf of the transition detection circuit 404. Compared to the transition detection circuit 404, the frequency divider 1002 has a relaxed driving requirement when driving all data samples $1008_0$-$1008_{m-1}$ (or $1009_0$-$1009_{m-1}$) at the same time. Since the output of the transition detection circuit 404 needs to drive the frequency divider 1002 only, the driving requirement of the transition detection circuit 404 can be relaxed. Further, since the first data sampler group 1003 and the second data sampler group 1004 are clocked by the rising edge and the falling edge of the clock signal CK, respectively and alternatively, 1-to-2 deserialization is also achieved by the data sampling circuit 1006.

Figure 11:
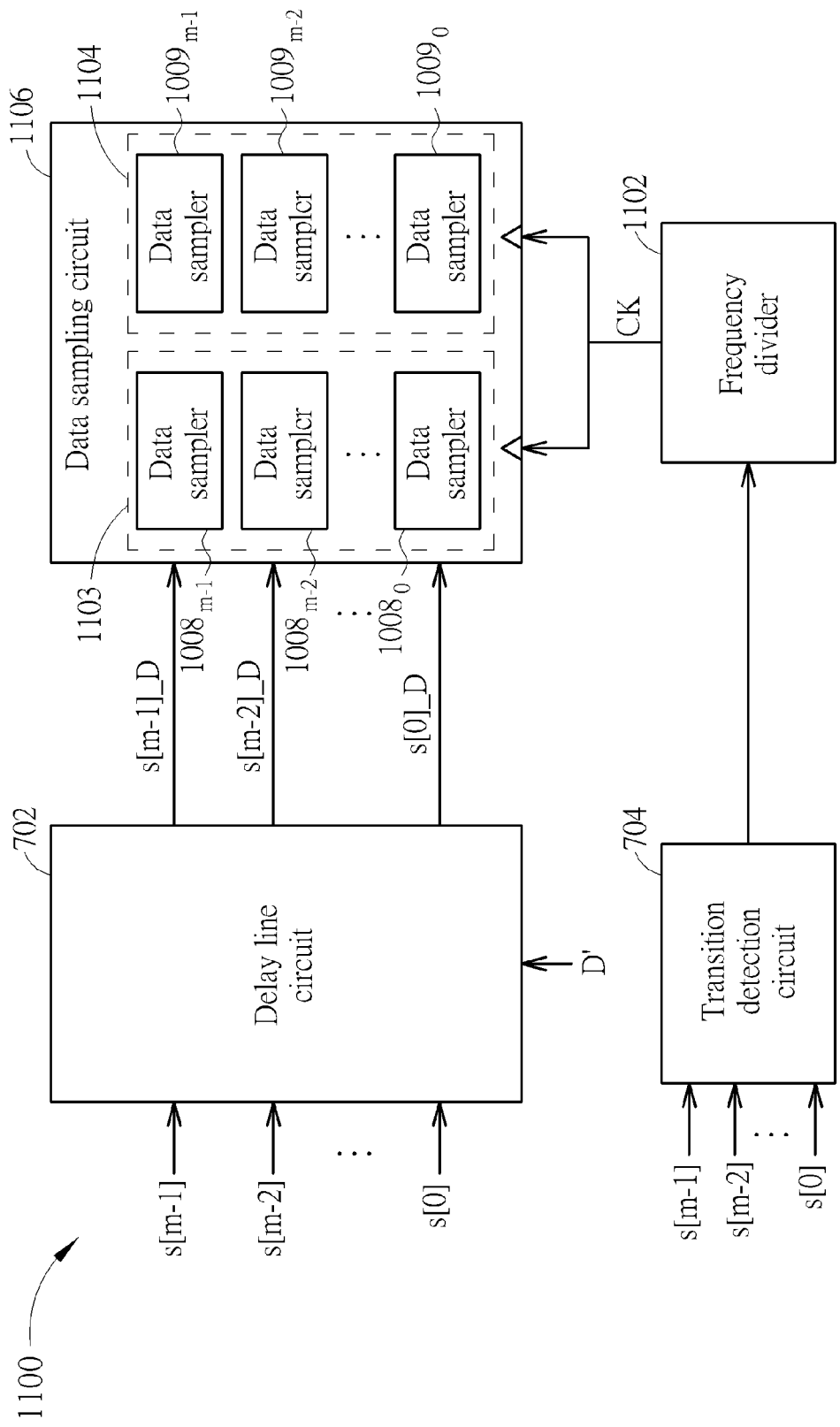
FIG. 11 is a diagram illustrating a TEC receiver according to a fourth embodiment of the present invention.

FIG. 11 is a diagram illustrating a TEC receiver according to a fourth embodiment of the present invention. The major difference between the TEC receivers 700 and 1100 is that the TEC receiver 1100 further has a frequency divider 1102 configured to drive a data sampling circuit 1106 with a plurality of data sampler groups (e.g., a first data sampler group 1103 and a second data sampler group 1104). In this embodiment, the first data sampler group 1103 is composed of a plurality of data samples $1108_0$-$1108_{m-1}$, and the second data sampler group 1104 is composed of a plurality of data samples $1109_0$-$1109_{m-1}$. The frequency divider 1102 is arranged to perform frequency division upon the output of the transition detection circuit 704 to generate a clock signal CK to the data sampling circuit 1106. For example, the frequency divider 1102 may be implemented using a divide-by-2 counter, such that an input of the frequency divider 1002 may be operated in a full-rate clock domain and an output of the frequency divider 1002 may be operated in a half-rate clock domain. Though the pulse width of the output of the transition detection circuit 704 is short, the duty cycle of the clock signal CK may be equal to or close to 50% due to inherent characteristics of the divide-by-2 counter. In this embodiment, the first data sampler group 1103 may be clocked by a rising edge of the clock signal CK, and the second data sampler group 1104 may be clocked by a falling edge of the clock signal CK. Hence, the data samplers $1108_0$-$1108_{m-1}$ are arranged to sample the delayed vector signals s [0]_D-s [m-1]_D according to the rising edge of the clock signal CK, respectively; and the data samplers $1109_0$-$1109_{m-1}$ are arranged to sample the delayed vector signals s [0]_D-s [m-1]_D according to the falling edge of the clock signal CK, respectively.

Compared to the output of the transition detection circuit 704, the clock signal CK has a lower clock rate and a longer logic-high/logic-low width. The frequency divider 1102 is used to drive the data sampling circuit 1106 on behalf of the transition detection circuit 704. Compared to the transition detection circuit 704, the frequency divider 1102 has a relaxed driving requirement when driving all data samples $1108_0$-$1108_{m-1}$ (or $1109_0$-$1109_{m-1}$) at the same time. Since the output of the transition detection circuit 704 needs to drive the frequency divider 1102 only, the driving requirement of the transition detection circuit 704 can be relaxed. Further, since the first data sampler group 1103 and the second data sampler group 1104 are clocked by the rising edge and the falling edge of the clock signal CK, respectively and alternatively, 1-to-2 deserialization is also achieved by the data sampling circuit 1106.

Figure 12:
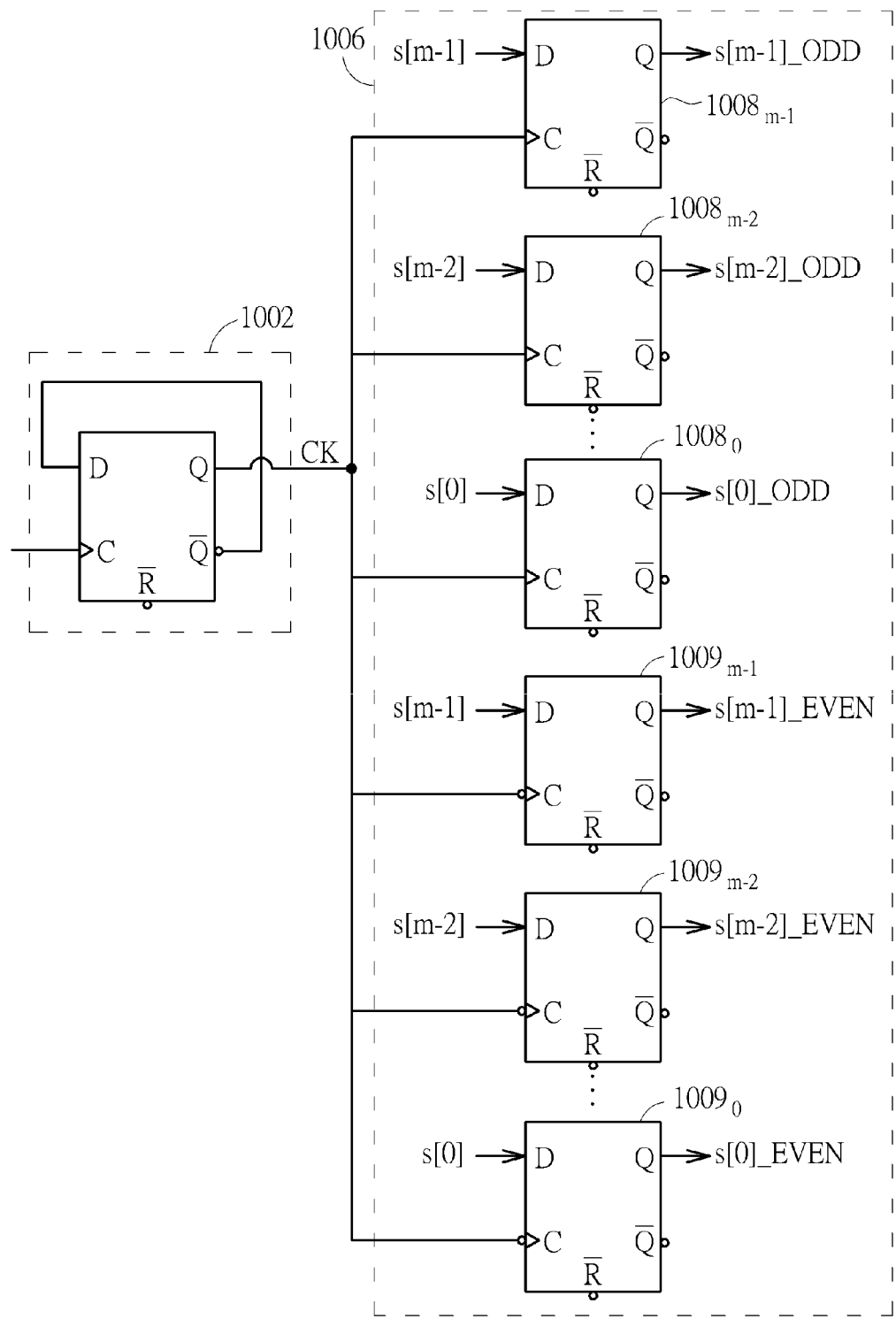
FIG. 12 is a diagram illustrating one circuit implementation of the frequency divider and the data sampling circuit shown in FIG. 10 according to an embodiment of the present invention.

FIG. 12 is a diagram illustrating one circuit implementation of the frequency divider 1002 and the data sampling circuit 1006 shown in FIG. 10 according to an embodiment of the present invention. In this embodiment, the frequency divider 1002 is implemented by configuring a DFF as a divide-by-2 counter. The data samplers $1008_0$-$1008_{m-1}$ are implemented using DFFs clocked by the rising edge of the clock signal CK to sample the vector signals s [0]-s [m-1] for generating sampled data bits s [0]_ODD-s [m-1]_ODD, respectively. The data samplers $1009_0$-$1009_{m-1}$ are implemented using DFFs clocked by the falling edge of the clock signal CK to sample the vector signals s [0]-s [m-1] for generating sampled data bits s [0]_EVEN-s [m-1]_EVEN, respectively.

Figure 13:
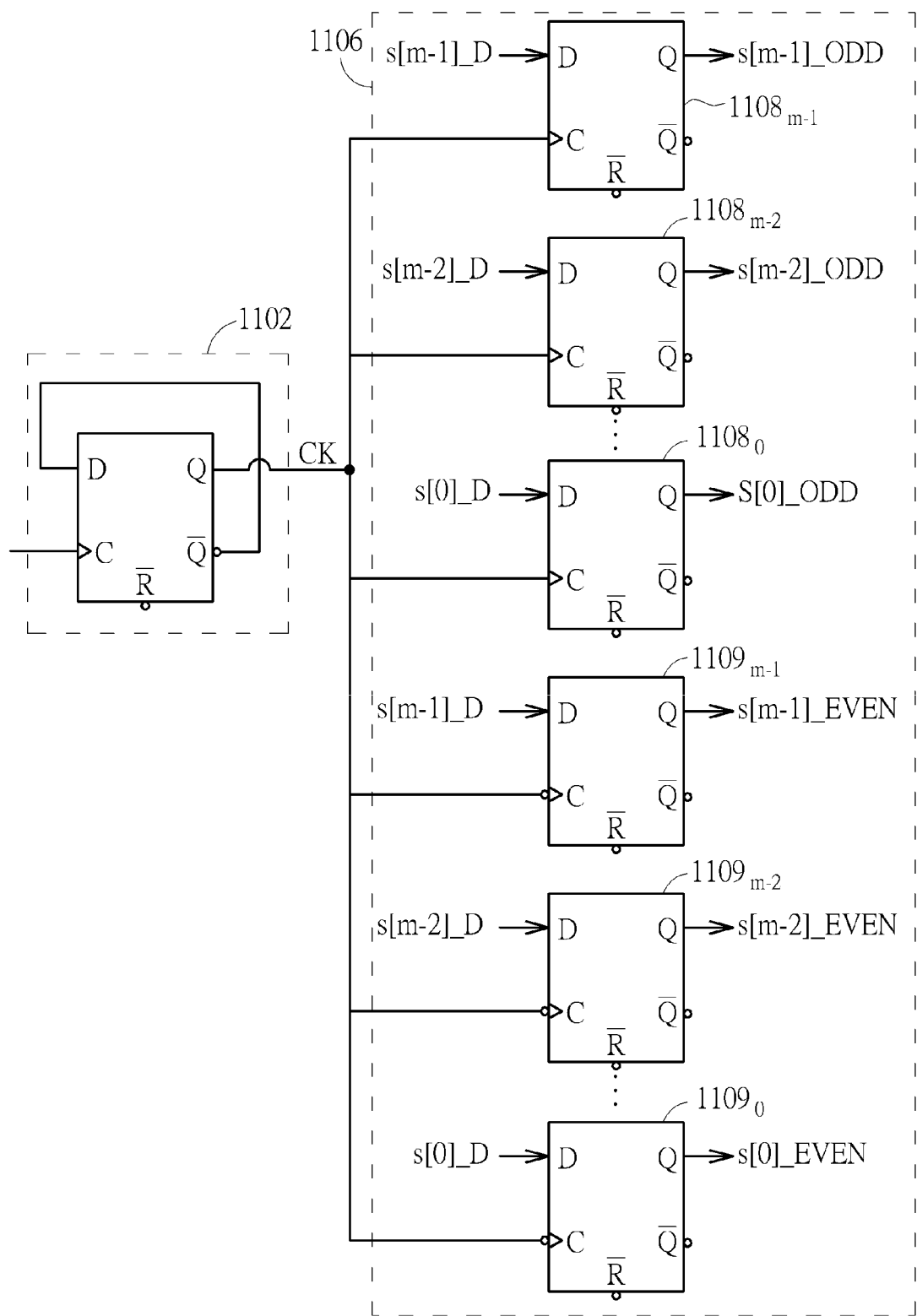
FIG. 13 is a diagram illustrating one circuit implementation of the frequency divider and the data sampling circuit shown in FIG. 11 according to an embodiment of the present invention.

FIG. 13 is a diagram illustrating one circuit implementation of the frequency divider 1102 and the data sampling circuit 1106 shown in FIG. 11 according to an embodiment of the present invention. In this embodiment, the frequency divider 1102 is implemented by configuring a DFF as a divide-by-2 counter. The data samplers $1108_0$-$1108_{m-1}$ are implemented using DFFs clocked by the rising edge of the clock signal CK to sample the delayed vector signals s [0]_D-s [m-1]_D for generating sampled data bits s [0]_ODD-s [m-1]_ODD, respectively. The data samplers $1109_0$-$1109_{m-1}$ are implemented using DFFs clocked by the falling edge of the clock signal CK to sample the delayed vector signals s [0]_D-s [m-1]_D for generating sampled data bits s [0]_EVEN-s [m-1]_EVEN, respectively.

With regard to the TEC receiver 400 shown in FIG. 4, the vector signals are first delayed by the delay line circuit 402 and then processed by the transition detection circuit 404 for last transition detection. In addition, the same delay line circuit is used to delay data and transition. However, these are for illustrative purposes only, and are not meant to be limitations of the present invention. The same concept shown in FIG. 2 may be achieved by applying appropriate modifications to the TEC receiver 400 shown in FIG. 4. Further details are described as below.

Figure 14:
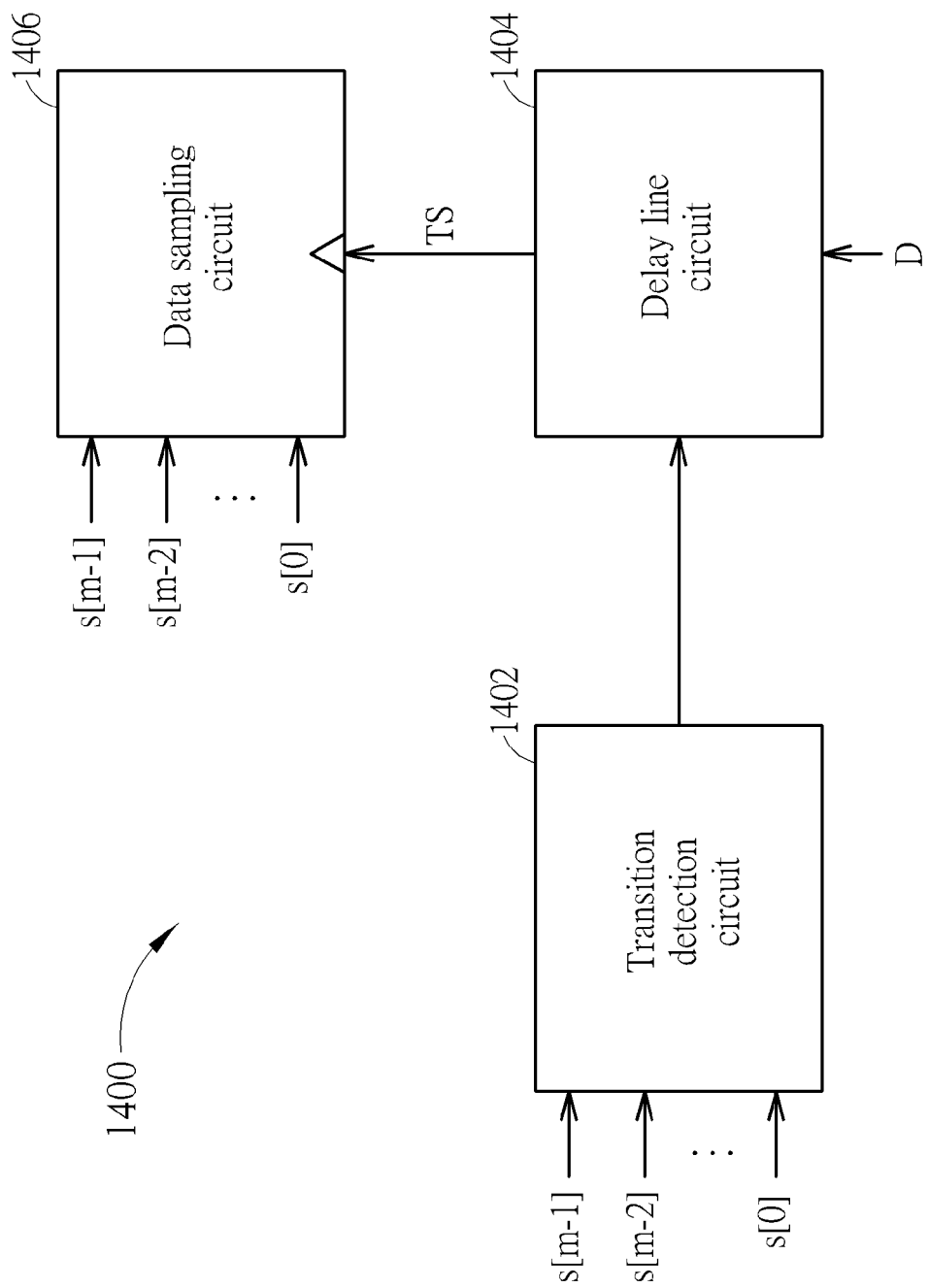
FIG. 14 is a diagram illustrating a TEC receiver according to a fifth embodiment of the present invention.

FIG. 14 is a diagram illustrating a TEC receiver according to a fifth embodiment of the present invention. The receiver 122 shown in FIG. 1 may be implemented using the TEC receiver 1400 shown in FIG. 14. The TEC receiver 1400 includes a transition detection circuit 1402, a delay line circuit 1404, and a data sampling circuit 1406. It should be noted that only the circuit components pertinent to the present invention are shown in FIG. 14. In practice, the TEC receiver 1400 may include additional circuit components. For example, the TEC receiver 1400 may have at least one deserializer used to further process an output of the data sampling circuit 1406.

The TEC receiver 1400 can be obtained by interchanging the transition detection circuit 404 and the delay line circuit 402 shown in FIG. 4. Hence, concerning the TEC receiver 1400 shown in FIG. 14, the transition detection circuit 1402 is arranged to detect a transition of at least one specific vector signal among the vector signals s [m-1]-s [0]. In this embodiment, the transition of the at least one specific vector signal is the last transition detected between adjacent states of the vector signals s [m-1]-s [0]. The delay line 1404 is arranged to generate a delayed signal according to the output of the transition detection circuit 1402, where the delay time D should be enough for a setup/hold time margin of the data sampling circuit 1406. The data sampling circuit 1406 is arranged to sample the vector signals s [m-1]-s [0] according to a sampling timing TS determined based on the delayed signal generated from the delay line circuit 1404. In this embodiment, the TEC receiver 1400 determines the sampling timing TS without using clock and data recovery (CDR). For example, the sampling timing TS is directly set by the timing of the intentionally delayed transition of the at least one specific vector signal (i.e., timing of the intentionally delayed last transition).

Figure 15:
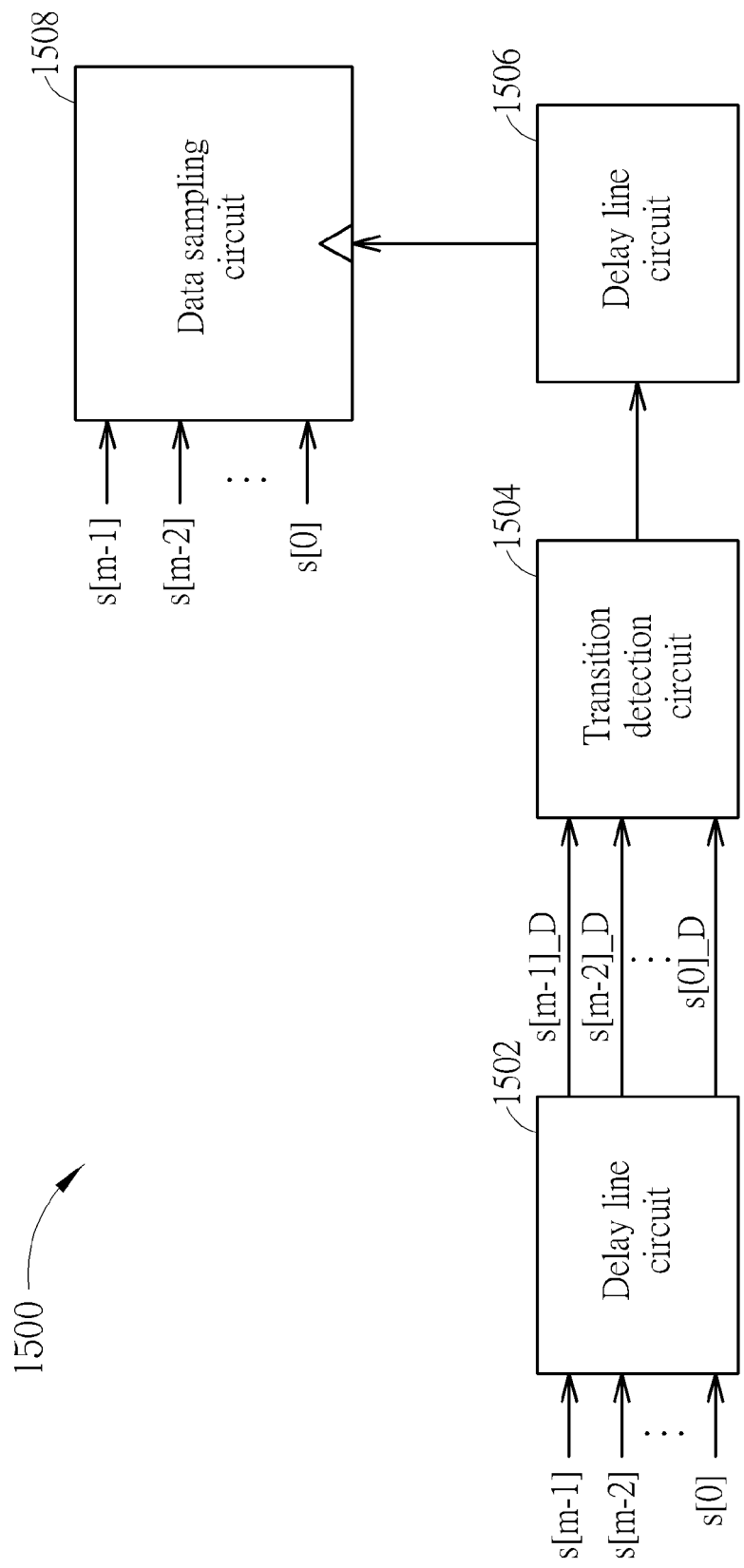
FIG. 15 is a diagram illustrating a TEC receiver according to a sixth embodiment of the present invention.

FIG. 15 is a diagram illustrating a TEC receiver according to a sixth embodiment of the present invention. The receiver 122 shown in FIG. 1 may be implemented using the TEC receiver 1500 shown in FIG. 15. The TEC receiver 1500 includes a plurality of delay line circuits 1502 and 1506, one located before a transition detection circuit 1504 and the other located between the transition detection circuit 1504 and a data sampling circuit 1508. It should be noted that only the circuit components pertinent to the present invention are shown in FIG. 15. In practice, the TEC receiver 1500 may include additional circuit components. For example, the TEC receiver 1500 may have at least one deserializer used to further process an output of the data sampling circuit 1508.

In this embodiment, the delay line circuit 1502 is arranged to delay the vector signals s [m-1]-s [0] for generating delayed vector signals s [m-1]_D-s [0]_D, where the delayed vector signals s [m-1]_D-s [0]_D are used by the transition detection circuit 1504 to detect a transition of at least one specific delayed vector signal. Since the delay line circuit 1502 is located before the transition detection circuit 1504, it is possible to overcome the skew issue among the vector signals s [m-1]-s [0] with certain calibration pattern. In other words, the delay line circuit 1502 may be configured to act as a de-skew circuit for aligning transition(s) between adjacent states of the vector signals s [m-1]-s [0].

In this embodiment, the transition of the at least one specific delayed vector signal is the last transition detected between adjacent states of the delayed vector signals s [m-1]_D-s [0]_D. The other delay line circuit 1506 is arranged to generate a delayed signal according to the output of the transition detection circuit 1504, wherein the sampling timing TS is determined based on the delayed signal. In this embodiment, the TEC receiver 1400 determines the sampling timing TS without using clock and data recovery (CDR). For example, the delay line circuit 1506 is used to delay the timing of the detected last transition for directly setting the sampling timing TS used by the data sampling circuit 1508 to sample the vector signals s [m-1]-s [0].

The feature of using a frequency divider to generate a clock signal with a lower clock rate and a longer period width for relaxing a driving requirement may be incorporated into the TEC receiver 1500 shown in FIG. 15.

Figure 16:
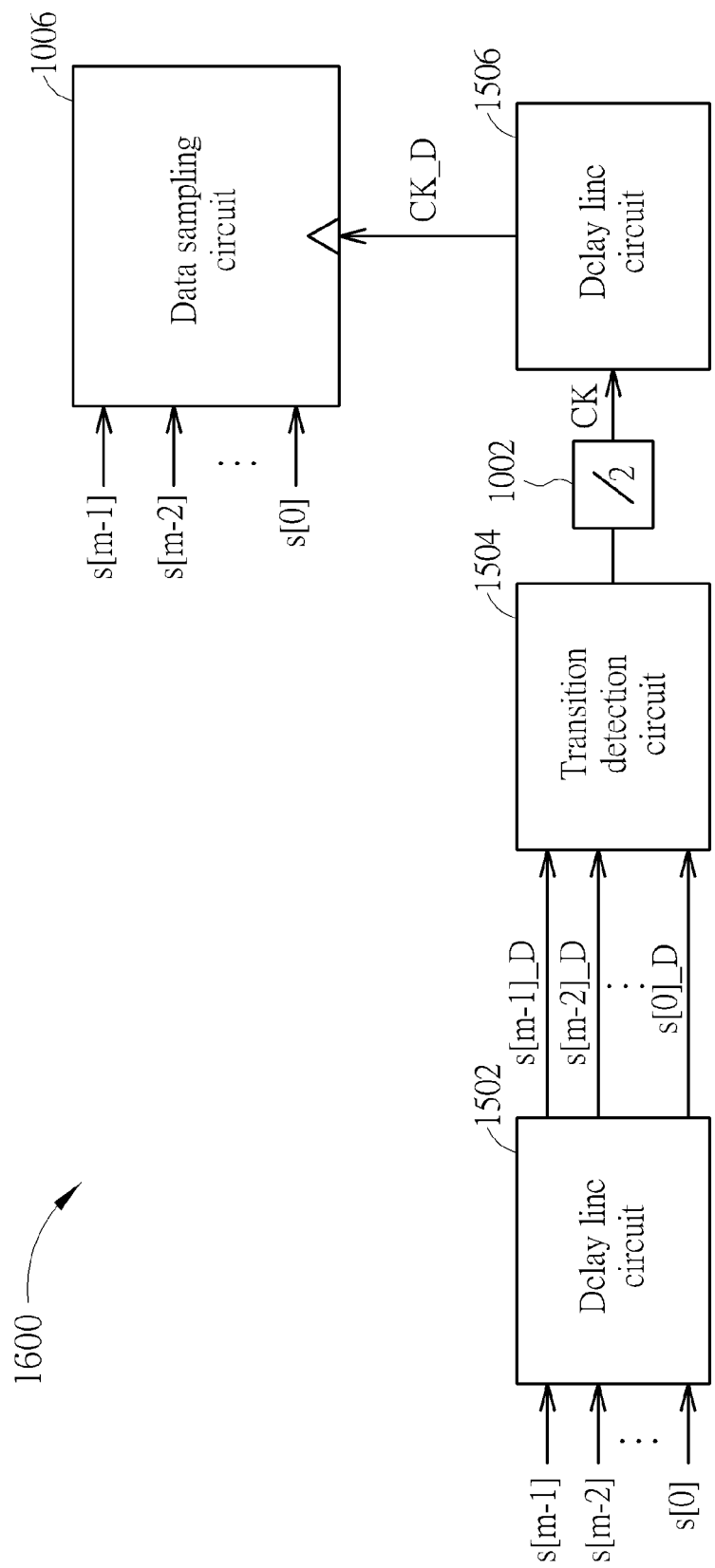
FIG. 16 is a diagram illustrating a TEC receiver according to a seventh embodiment of the present invention.

FIG. 16 is a diagram illustrating a TEC receiver according to a seventh embodiment of the present invention. In this embodiment, the data sampling function may be implemented using the data sampling circuit 1006 shown in FIG. 10, and the frequency divider (e.g., divide-by-2 counter) 1002 may be located between the transition detection circuit 1504 and the delay line circuit 1506. Hence, after the frequency divider 1002 generates the clock signal CK according to the output of the transition detection circuit 1504, the delay line circuit 1506 delays the clock signal CK to generate a delayed clock signal CK_D to the data sampling circuit 1006. Since the delay line circuit 1506 delays the clock signal CK to generate the delayed clock signal CK_D as the delayed signal used to set the sampling timing of the data sampling circuit 1006, the data samplers $1008_0$-$1008_{m-1}$ in the data sampling circuit 1006 are arranged to sample the vector signals s [0]-s [m-1] according to a rising edge of the delayed clock signal CK_D, respectively, and the data samples $1009_0$-$1009_{m-1}$ in the data sampling circuit 1006 are arranged to sample the vector signals s [0]-s [m-1] according to a falling edge of the delayed clock signal CK_D, respectively.

Figure 17:
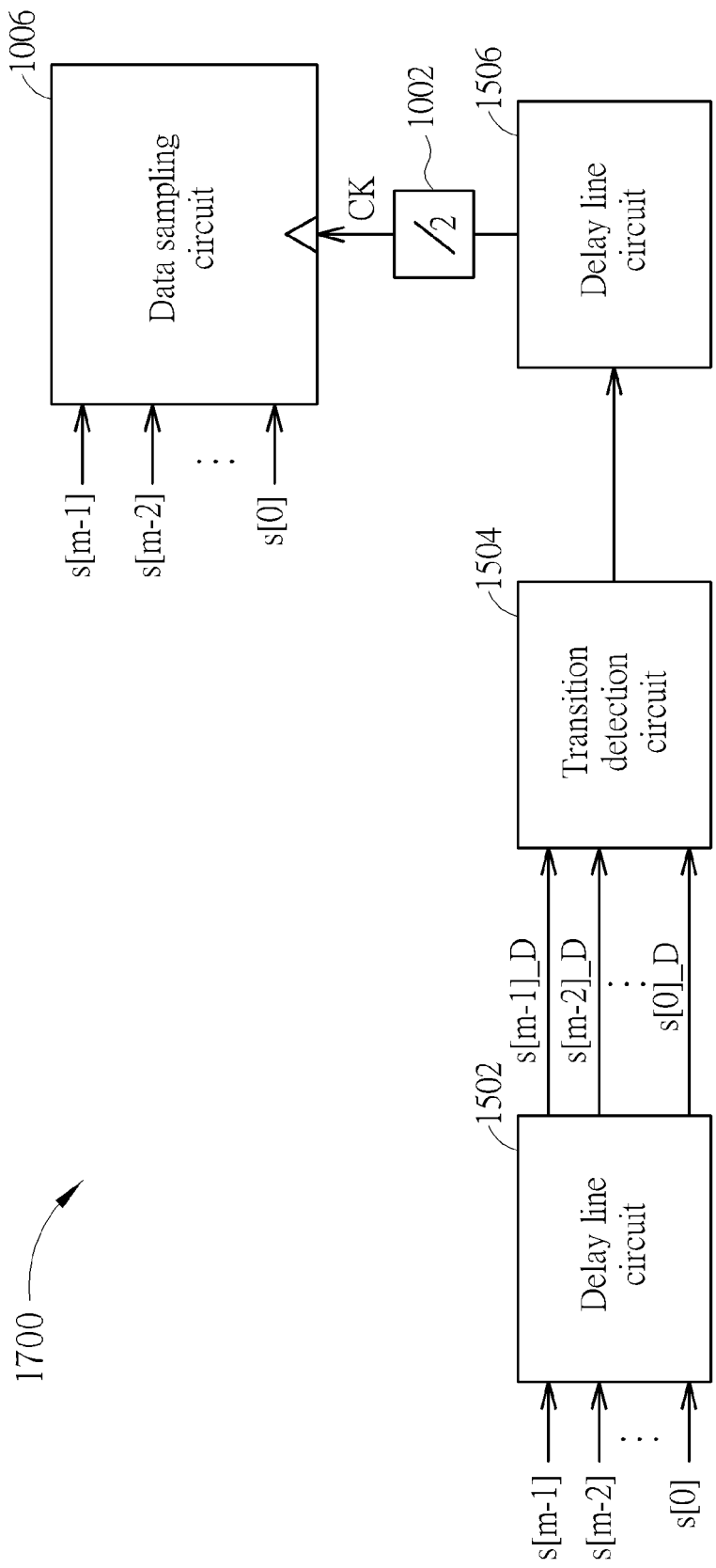
FIG. 17 is a diagram illustrating a TEC receiver according to an eighth embodiment of the present invention.

FIG. 17 is a diagram illustrating a TEC receiver according to an eighth embodiment of the present invention. In this embodiment, the data sampling function may be implemented using the data sampling circuit 1006 shown in FIG. 10, and the frequency divider (e.g., divide-by-2 counter) 1002 may be located between the delay line circuit 1506 and the data sampling circuit 1006. Hence, after the delay line circuit 1506 generates the delayed signal according to the output of the transition detection circuit 1504, the frequency divider 1002 generates the clock signal CK according to the delayed signal. Hence, the data samplers $1008_0$-$1008_{m-1}$ in the data sampling circuit 1006 are arranged to sample the vector signals s [0]-s [m-1] according to a rising edge of the clock signal CK, respectively, and the data samples $1009_0$-$1009_{m-1}$ in the data sampling circuit 1006 are arranged to sample the vector signals s [0]-s [m-1] according to a falling edge of the clock signal CK, respectively.

As illustrated in FIG. 2, the data bits transmitted via the vector signals s [2], s [1] and s [0] can be correctly recovered by the sampling timing determined directly based on a delayed version of the last transition detected between adjacent states of the vector signals s [2], s [1] and s [0]. However, the delayed last transition is unable to obtain a sampling result of the beginning state of the vector signals s [2], s [1] and s [0]. With regard to a TEC receiver employing the concept illustrated in FIG. 2, a data sampling circuit may be arranged to output a pre-defined bit pattern as a sampling result of the beginning state of the vector signals. That is, the TEC algorithm employed by the transmitter side may enforce the beginning state of the vector signals to have the pre-defined bit pattern, thus allowing the beginning state of the vector signals to be correctly reproduced at the receiver side using the same TEC algorithm.

As illustrated in FIG. 3, the data transmitted via the vector signals s [2], s [1] and s [0] can be correctly recovered by the sampling timing determined directly based on an advanced version of the first transition detected between adjacent states of the vector signals s [2], s [1] and s [0]. However, the advanced first transition is unable to obtain a sampling result of the ending state of the vector signals s [2], s [1] and s [0]. With regard to a TEC receiver employing the concept illustrated in FIG. 3, a data sampling circuit may be arranged to output a pre-defined bit pattern as a sampling result of the ending state of vector signals. That is, the TEC algorithm employed by the transmitter may enforce the ending state of the vector signals to have the pre-defined bit pattern, thus allowing the ending state of the vector signals to be correctly reproduced at the receiver side using the same TEC algorithm.

Figure 18:
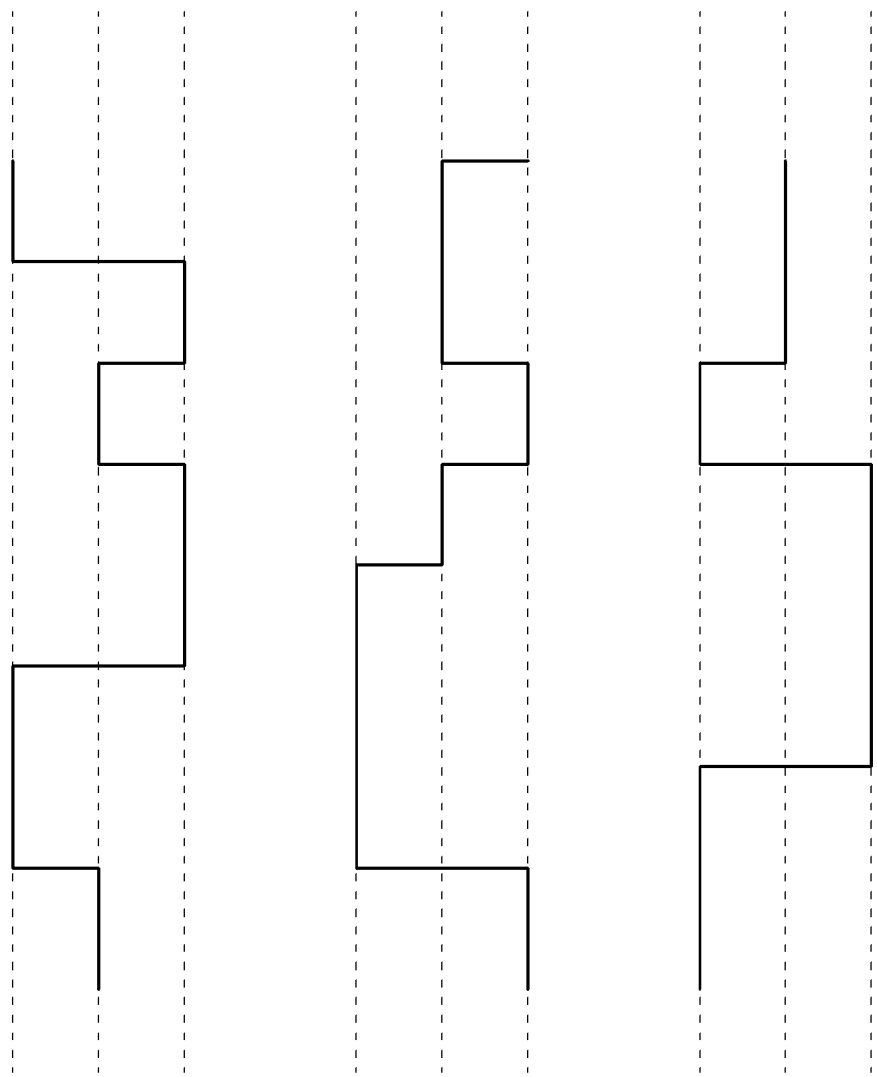
FIG. 18 is a diagram illustrating multi-level vector signals according to an embodiment of the present invention.

In above embodiments, each of the vector signals s [m-1]-s [0] may be a voltage signal having binary voltage levels to represent logic-0 or logic-1. Alternatively, each of the vector signals s [m-1]-s [0] may be a multi-level signal such as a voltage signal with more than two voltage levels. FIG. 18 is a diagram illustrating multi-level vector signals according to an embodiment of the present invention. The vector signals implemented using multi-level signals may achieve the transition enforcing coding in an analog domain (i.e., a voltage domain). For example, the encoder 112 and the decoder 124 may be omitted, and each bit in the binary data b[n-1:0] can be transition enforcing encoded/decoded by using a particular combination of voltage levels possessed by the multi-level signals.

Figure 19:
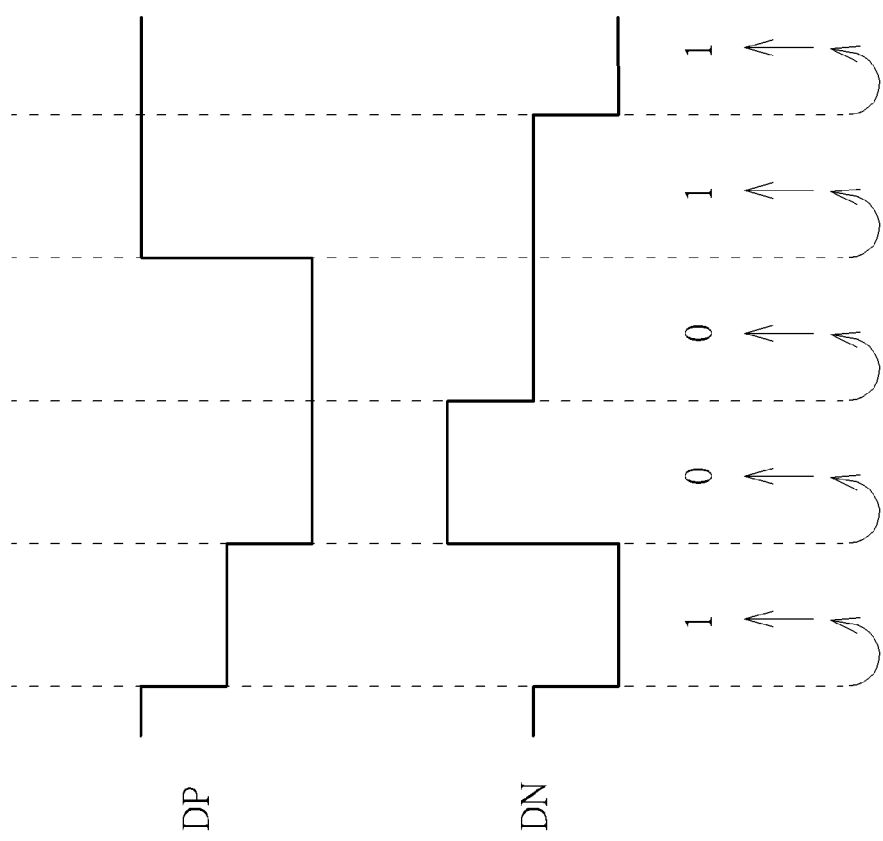
FIG. 19 is a diagram illustrating level transitions defined by multi-level signals transmitted via differential pins according to an embodiment of the present invention.

Moreover, the multi-level vector signals may be used for reducing the pin count of a transmission interface and/or carrying more information. For example, the multi-level can be used in differential pins DP and DN to define a level transition, as illustrated in FIG. 19.

Figure 20:
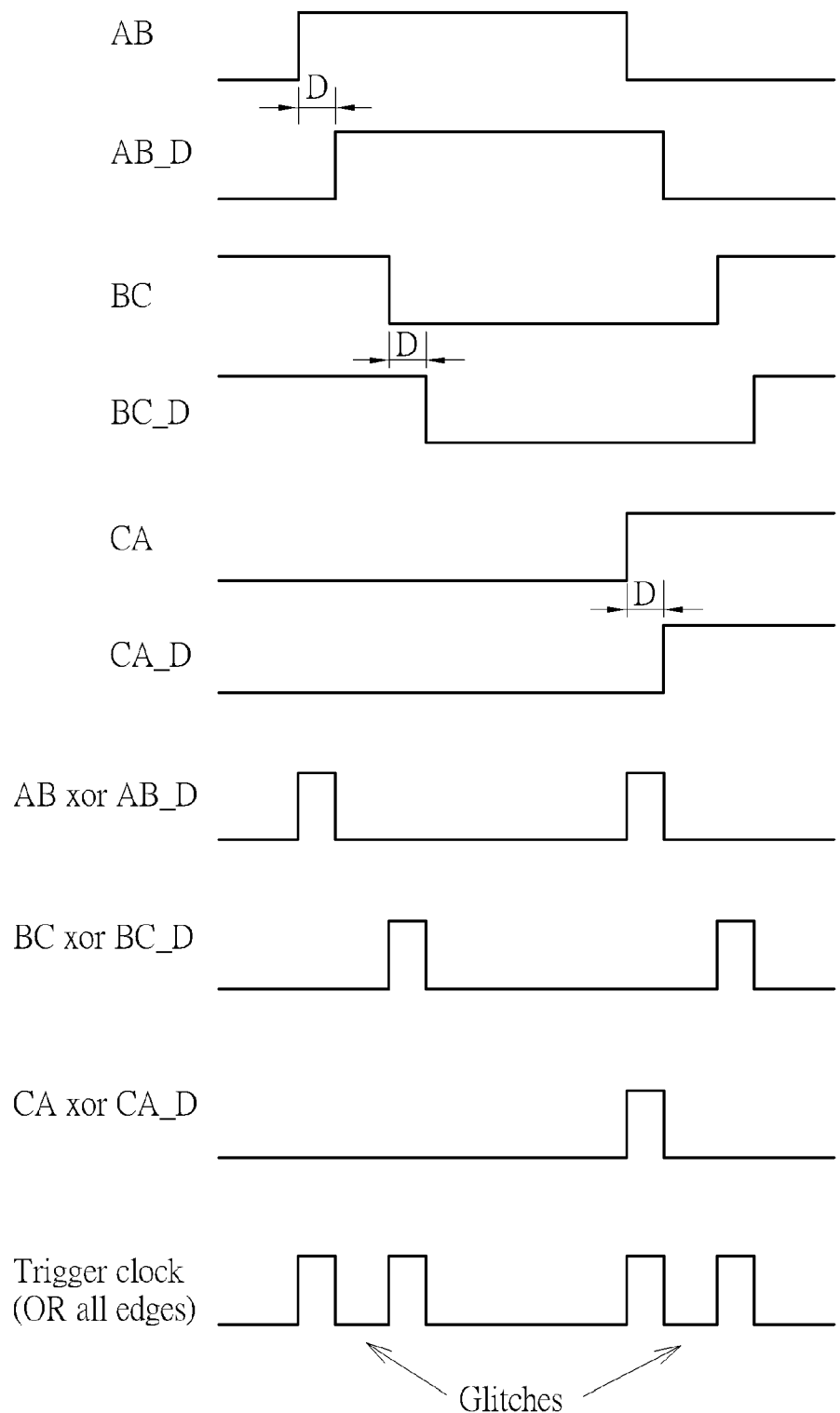
FIG. 20 is a diagram illustrating a case where a trigger clock suffers from glitches due to a short delay time.

As shown in FIG. 2, the vector signals s [2], s [1] and s [0] are received by a TEC receiver from parallel channels, respectively. However, when there are multiple transitions occurring between a current state during a current transmission clock cycle and a next state during a next transmission clock cycle, it is possible that the timing of the multiple transitions may not be aligned with each other due to certain factors. The timing difference between the multiple transitions is called coding jitter resulting from skew or multi-level transition(s) of different vector signals. If the delay time D employed by the delay line circuit 402 is not long enough to conceal the coding jitter, the sampling timing TS defined by a trigger clock generated from the transition detection circuit 404 to the data sampling circuit 406 would suffer from the undesired glitches. FIG. 20 is a diagram illustrating a case where a trigger clock suffers from glitches due to the short delay time D. Suppose that there are three vector signals AB, BC and CA. Hence, in accordance with the exemplary transition detection circuit design shown in FIG. 6, the vector signals AB, BC and CA and the associated delayed vector signals AB_D, BC_D and CA_D are used to generate a trigger clock which defines the sampling timing TS. However, the delay time D applied to the vector signals AB, BC and CA is not long enough in this case. As a result, the trigger clock suffers from glitches, and provides incorrect sampling timing TS.

Figure 21:
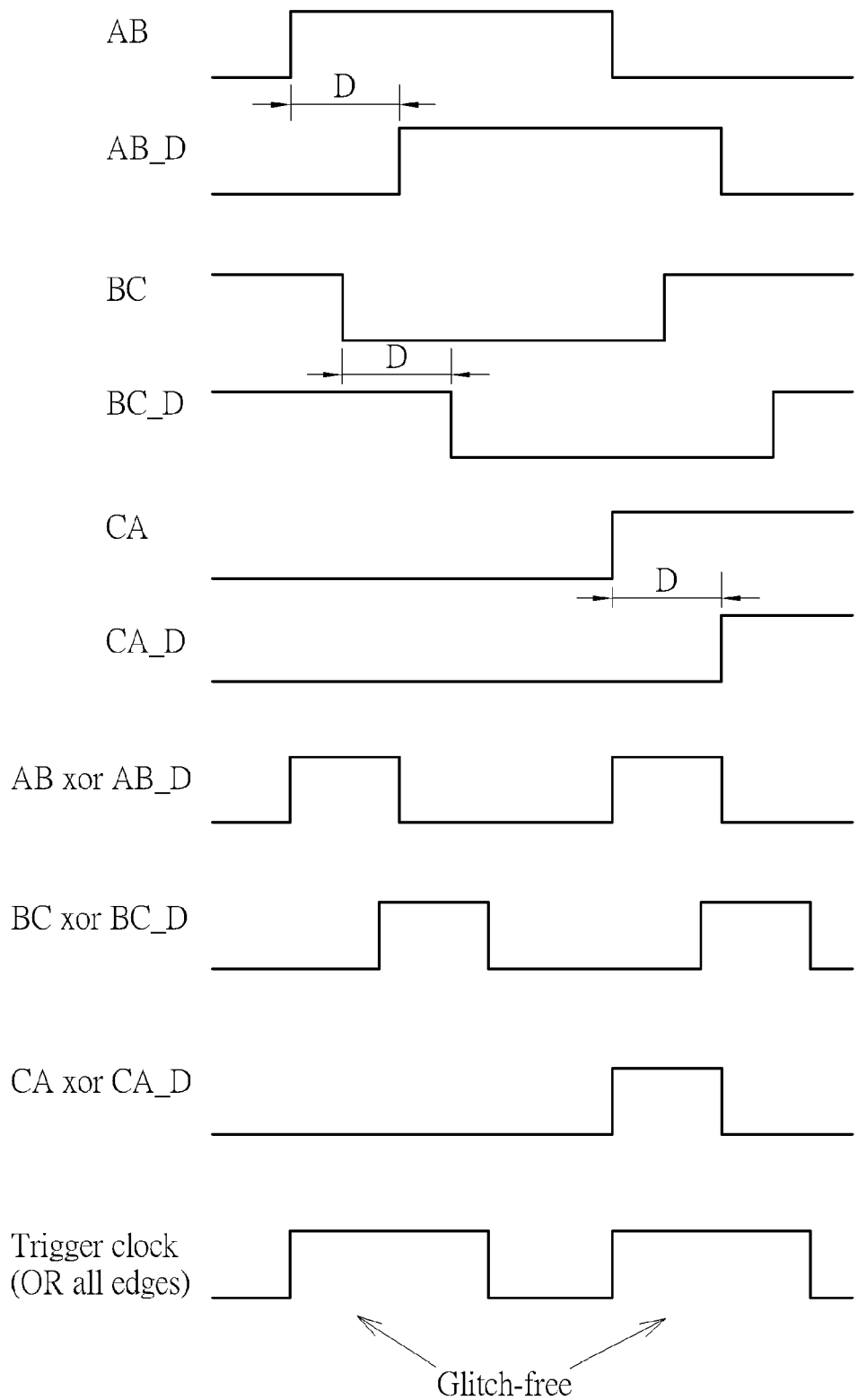
FIG. 21 is a diagram illustrating a case where a glitch-free trigger clock is generated due to a properly configured delay time.

On the contrary, if the delay time D employed by the delay line circuit 402 is properly set, the sampling timing TS defined by a trigger clock generated from the transition detection circuit 404 to the data sampling circuit 406 would be glitch-free. FIG. 21 is a diagram illustrating a case where a glitch-free trigger clock is generated due to the properly configured delay time D. Since the delay time D applied to the vector signals AB, BC and CA is long enough, glitches are not introduced by the combinational logic of the transition detection circuit 404.

Figure 22:
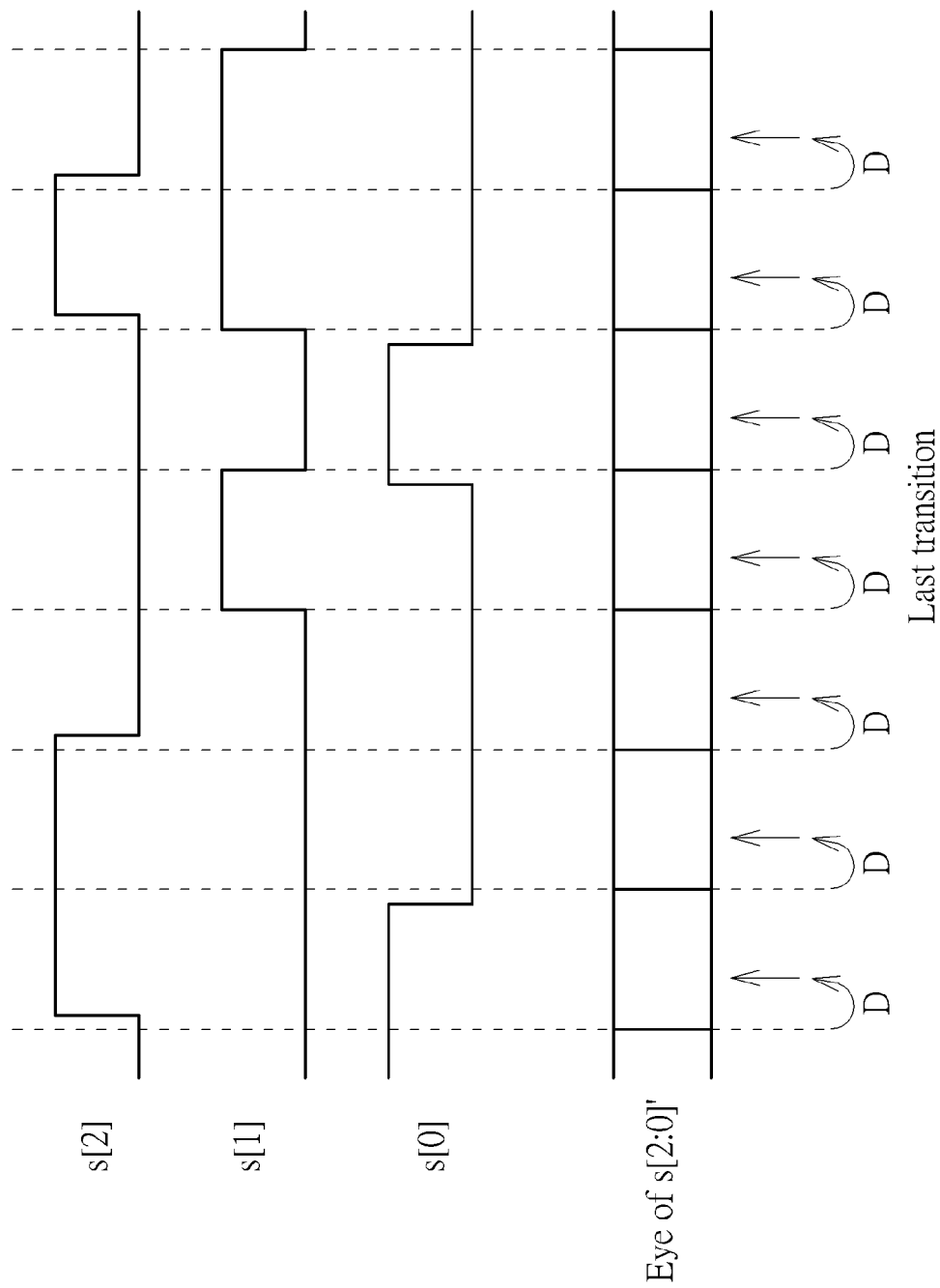
FIG. 22 is a diagram illustrating a concept of sampling vector signals by using sampling timing that is determined based on de-skewed vector signals according to an embodiment of the present invention.

To prevent the trigger clock from suffering from glitches, the present invention therefore proposes using a de-skew scheme to minimize or cancel the timing difference (i.e., coding jitter) between the multiple transitions of different vector signals. FIG. 22 is a diagram illustrating a concept of sampling vector signals by using sampling timing that is determined based on de-skewed vector signals according to an embodiment of the present invention. Supposing that m=3, three vector signals s [2], s [1] and s [0] are received by a TEC receiver from parallel channels, respectively. Concerning generation of the sampling timing, the vector signals s [2], s [1] and s [0] are de-skewed generate de-skewed vector signals s [2:0]', respectively. As shown in FIG. 22, when there are multiple transitions occurring between a current state during a current transmission clock cycle and a next state during a next transmission clock cycle, the timing of the multiple transitions are aligned with each other due to the employed de-skew scheme. As mentioned above, the TEC makes at least one transition always happen between adjacent states of the vector signals. The last transition between the adjacent states (e.g., around an edge of one transmission clock cycle) can be detected. If there is only one transition occurring between adjacent states of the vector signals, this detected transition is regarded as the last transition. If there are multiple transitions occurring between adjacent states of the vector signals, any of the detected transitions that are aligned with each other is regarded as the last transition. The timing of the detected last transition can be delayed by one predetermined delay time D to be one sampling timing of the received vector signals s [2], s [1] and s [0]. As can be seen from the eye diagram of the de-skewed vector signals s [2:0]', the signal level from the last transition between a current state transition to the first transition between a next state transition is stable and clean. In addition, the sampling timing of the received vector signals s [2], s [1] and s [0] does not suffer from glitches due to the fact that the sampling timing is derived from the de-skewed vector signals s [2:0]'. Hence, data bits representative of one state of the vector signals s [2], s [1] and s [0] can be correctly recovered by the sampling timing determined directly based on a delayed version of the last transition detected between adjacent states of the de-skewed vector signals s [2:0]'.

In some embodiment of the present invention, a delay line circuit used in a TEC receiver may also serve as a de-skew circuit. That is, the de-skew function is achieved by controlling the delay time settings applied to different test vector signals received by the TEC receiver. Further details of the de-skew design are described as below.

Figure 23:
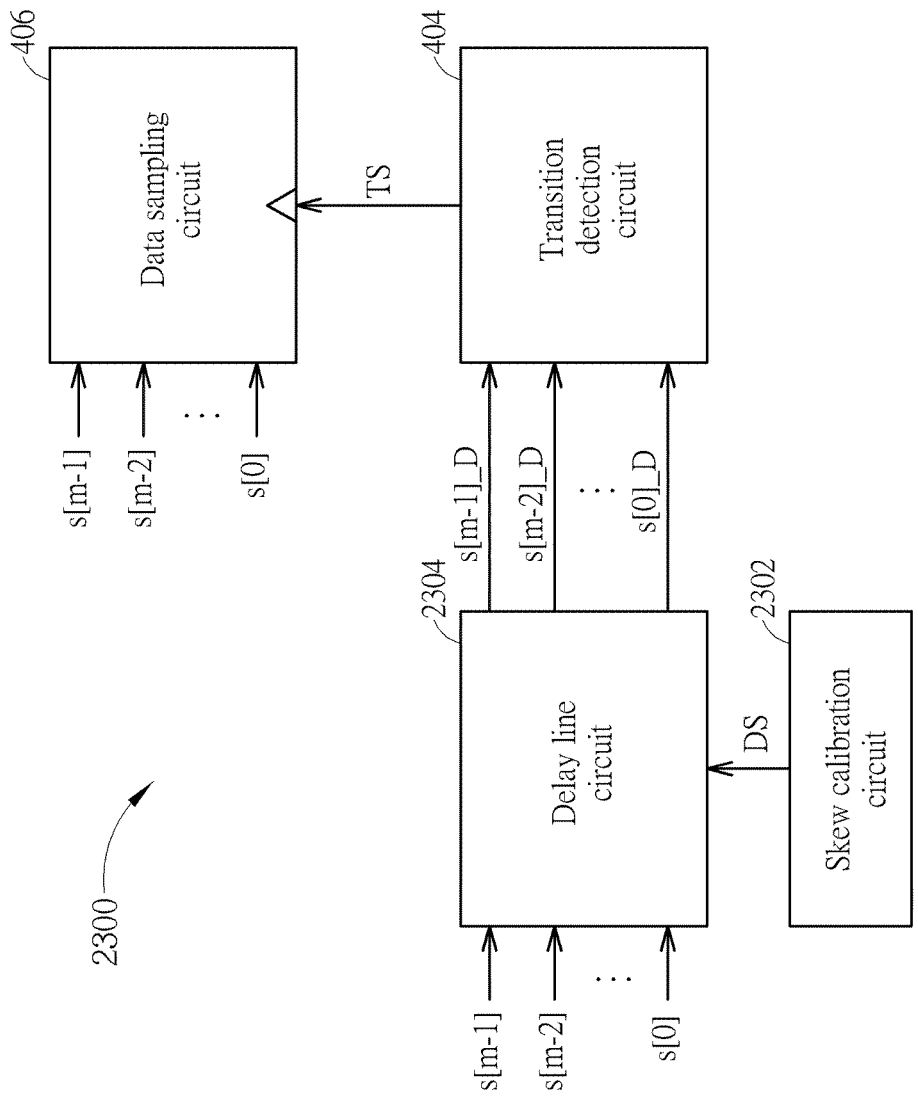
FIG. 23 is a diagram illustrating a TEC receiver with skew calibration according to a first embodiment of the present invention.

FIG. 23 is a diagram illustrating a TEC receiver with skew calibration according to a first embodiment of the present invention. The receiver 122 shown in FIG. 1 may be implemented using the TEC receiver 2300 shown in FIG. 23. The TEC receiver 2300 includes a skew calibration circuit 2302, a delay line circuit 2304, a transition detection circuit 404, and a data sampling circuit 406. It should be noted that only the circuit components pertinent to the present invention are shown in FIG. 23. In practice, the TEC receiver 2300 may include additional circuit components. For example, the TEC receiver 2300 may have at least one deserializer used to further process an output of the data sampling circuit 406.

In this embodiment, the skew calibration circuit 2302 is configured to set a calibrated delay setting DS under a calibration mode. The delay line circuit 2304 employs the calibrated delay setting DS (which may include a plurality of different delay times) to delay a plurality of vector signals s [m-1], s [m-2] . . . s [0] to generate a plurality of delayed vector signals s [m-1]_D, s [m-2]_D . . . s [0]_D under a normal mode, respectively, wherein transition skew between different delayed vector signals is reduced by the calibrated delay setting DS under the normal mode. Unlike the aforementioned delay line circuit 402 using the same delay time D for all vector signals, the delay line circuit 2304 employs different delay times for different vector signals such that the skew of the different vector signals can be minimized or cancelled. In addition, the delay time D required for setting the sampling timing TS without using clock and data recovery (CDR) may also be considered for setting the calibrated delay setting DS. That is, the calibrated delay setting DS employed by the delay line circuit 2304 can achieve the CDR-less sampling timing setting function as well as the de-skew function.

Figure 24:
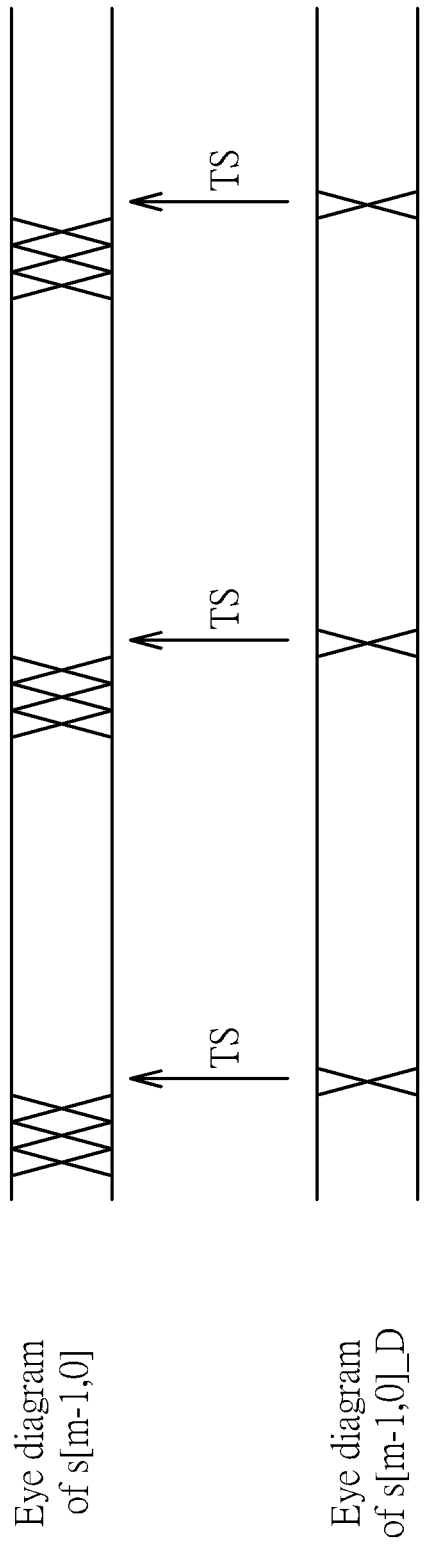
FIG. 24 is a diagram illustrating an example of a data sampling operation performed by the TEC receiver shown in FIG. 23.

FIG. 24 is a diagram illustrating an example of a data sampling operation performed by the TEC receiver 2300 shown in FIG. 23. The TEC receiver 2300 may be configured on the basis of the concept shown in FIG. 22. The vector signals s [m-1]_D-s [0]_D are de-skewed and delayed vector signals, and are checked by the transition detection circuit 404 to find the last transition between adjacent states. Since the delayed vector signals s [m-1]_D-s [0]_D are de-skewed, the last transition may be a single transition or any of multiple aligned transitions, depending upon the number of transitions occurring between adjacent states. In addition, the timing of the last transition possessed by at least one of the delayed vector signals s [m-1]_D-s [0]_D is equivalent to a delayed version of the timing of the last transition possessed by at least one of the de-skewed vector signals. Hence, the timing of the last transition possessed by at least one of the delayed vector signals s [m-1]_D-s [0]_D can be directly used as the sampling timing TS of the data sampling circuit 406 for getting sampled data from the vector signals s [m-1]-s [0].

Figure 25:
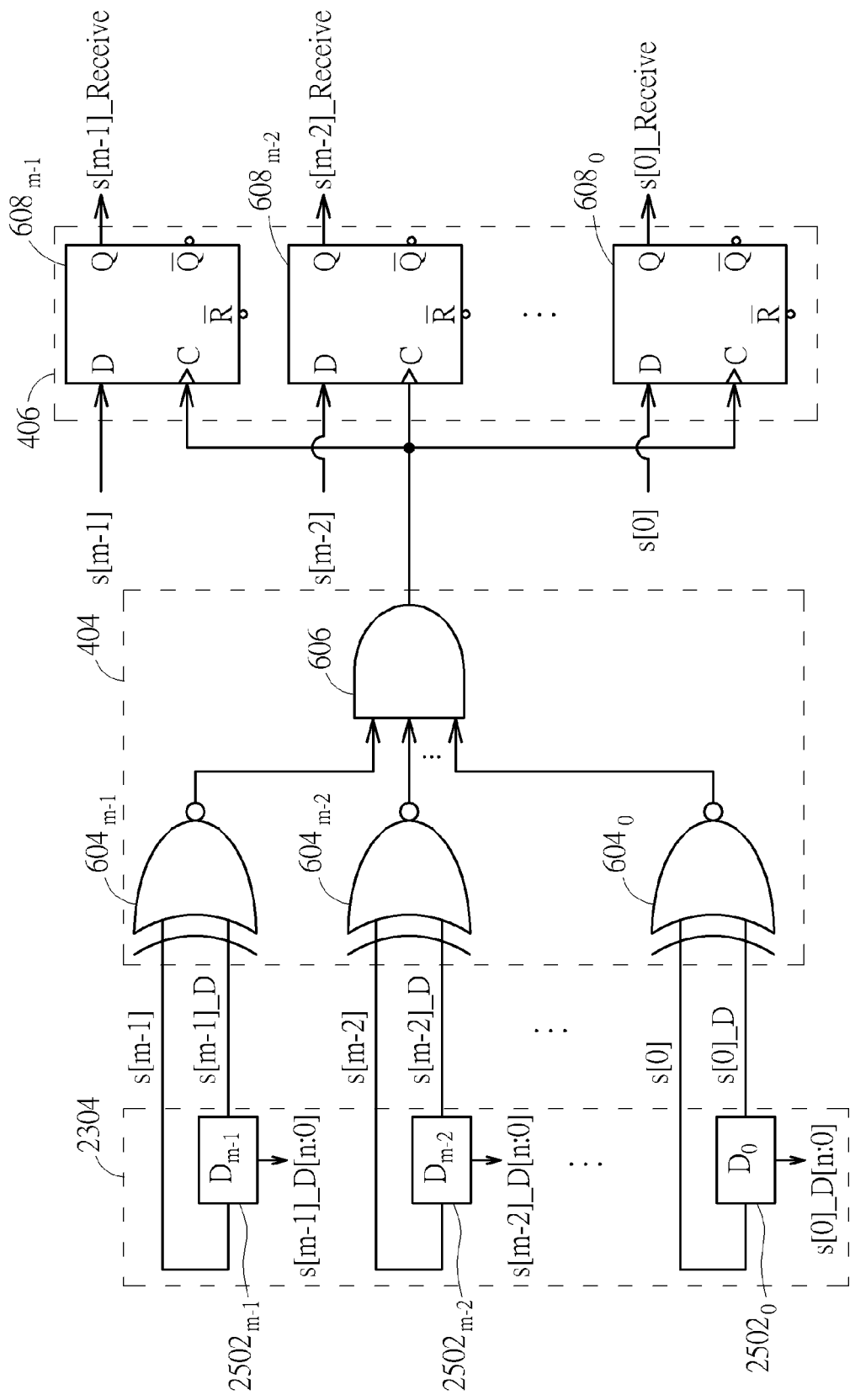
FIG. 25 is a diagram illustrating one circuit implementation of a delay line circuit, a transition detection circuit and a data sampling circuit shown in FIG. 23.
Figure 26:
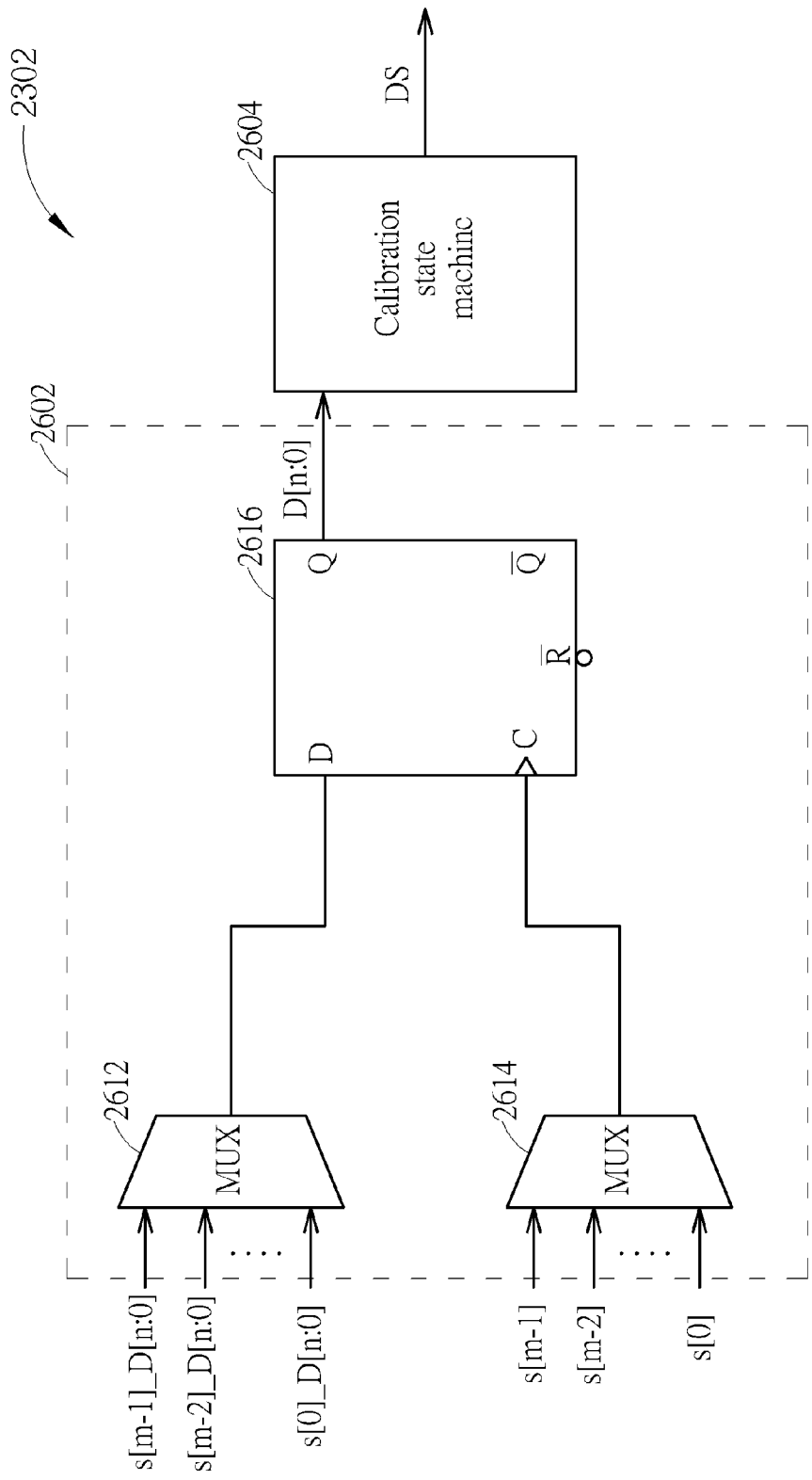
FIG. 26 is a diagram illustrating one circuit implementation of a skew calibration circuit shown in FIG. 23.

In a first exemplary design, the delay line circuit 2304 shown in FIG. 23 may be reused in the calibration mode to provide signals needed by the skew calibration performed by the skew calibration circuit 2302. Please refer to FIG. 25 in conjunction with FIG. 26. FIG. 25 is a diagram illustrating one circuit implementation of the delay line circuit 2304, transition detection circuit 404 and data sampling circuit 406 shown in FIG. 23. FIG. 26 is a diagram illustrating one circuit implementation of the skew calibration circuit 2302 shown in FIG. 23. When the TEC receiver 2300 operates in a normal mode, the delay line circuit 2304, the transmission detection circuit 404 and the data sampling circuit 406 are enabled, and the skew calibration circuit 2302 is disabled. When the TEC receiver 2300 operates in a calibration mode, the transmission detection circuit 404 and the data sampling circuit 406 are disabled, and the skew calibration circuit 2302 and the delay line circuit 2304 are enabled. Hence, the delay line circuit 2304 is used in both of the normal mode and the calibration mode. The delay line circuit 2304 includes a plurality of delay lines $2502_0$-$2502_{m-1}$. The delay lines $2502_0$-$2502_{m-1}$ are used under the normal mode for generating the delayed vector signals s [0]_D-s [m-1]_D to the following transmission detection circuit 404 according to the vector signals s [0]-s [m-1] (which are normal vector signals transmitted from a counterpart TEC transmitter under the normal mode) and the calibrated setting DS (which includes a plurality of delay times $D_{m-1}$-$D_0$ that are set under the calibration mode and are not necessarily the same), and are further used under the calibration mode for providing a plurality of delayed test vector signals s [m-1]_D[n:0], s [m-2]_D[n:0]_D[n:0] for each of the vector signals s [0]-s [m-1] (which are test vector signals transmitted from the counterpart TEC transmitter under the calibration mode). For example, when operating in the calibration mode, each delay line (e.g., $2502_{m-1}$) applies different numbers of unit delays to an incoming test vector signal (e.g., s [m-1]) to generate delayed test vector signals (e.g., s [m-1]_D[n] . . . s [m-1]_D[0]), where each unit delay is provided by one delay cell implemented in the delay line, and the number of unit delays applied to the test vector signal depends on the number of cascaded delay cells that the test vector signal passes through. Hence, the delayed test vector signals (e.g., s [m-1]_D [n] . . . s [m-1]_D [0]) have different delay times with respect to the corresponding test vector signal (e.g. , s [m-1]). The delayed test vector signals s [m-1]_D [n:0], s [m-2]_D [n:0] . . . s [0]_D [n:0] are supplied to the skew calibration circuit 2302 for further processing.

As shown in FIG. 26, the skew calibration circuit 2302 includes a time-to-digital converter (TDC) 2602 and a calibration state machine 2604. The TDC 2602 is a processing circuit configured to measure a plurality of time differences, each between two of the test vector signals s [0]-s [m-1] received under the calibration mode. Each of the measured time differences is indicated by one corresponding TDC code composed of sampled bits D [n:0]. The calibration state machine 2604 is a processing circuit configured to determine the calibrated delay setting DS (which includes delay times $D_{m-1}$-$D_0$ that will be applied to the normal vector signals s [0]-s [m-1] received under the normal mode) according to the time differences (which are indicated by TDC codes measured by the TDC 2602). For example, assuming that the test vector signals s [0]-s [m-1] include s [0], s [1] and s [2] (m=3), the TDC 2602 is used to measure the time difference $TD_{0-2}$ between s [0] and s [2], the time difference $TD_{0-1}$ between s [0] and s [1], and the time difference $TD_{1-2}$ between s [1] and s [2], and the calibration state machine 2604 refers to at least the time differences $TD_{0-1}, TD_{0-2}, TD_{1-2}$ to determine the calibrated delay setting DS.

Figure 27:
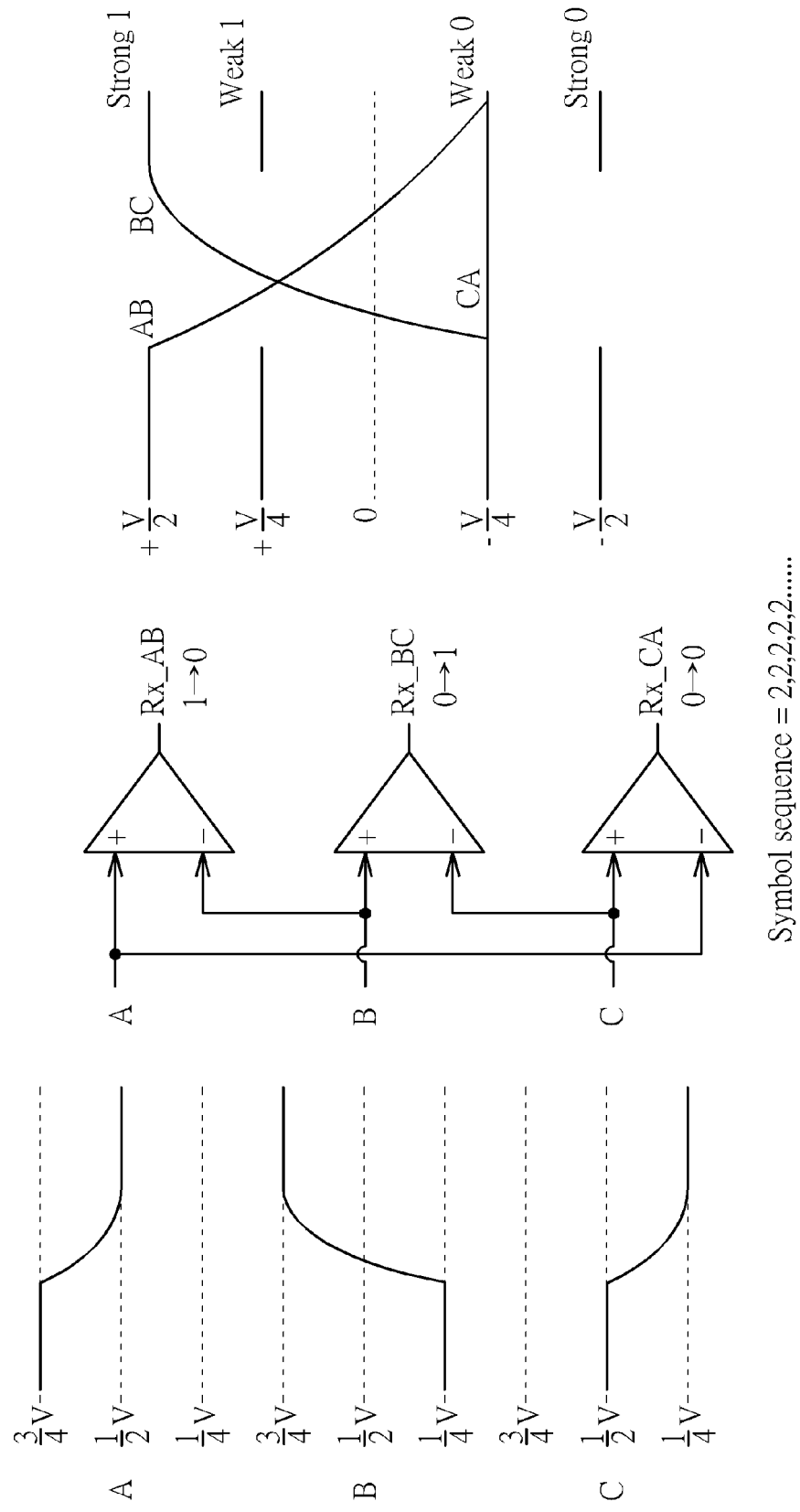
FIG. 27 is a diagram illustrating a sequence of "2" symbols (which are double-transition symbols) according to the MIPI C-PHY specification.
Figure 28:
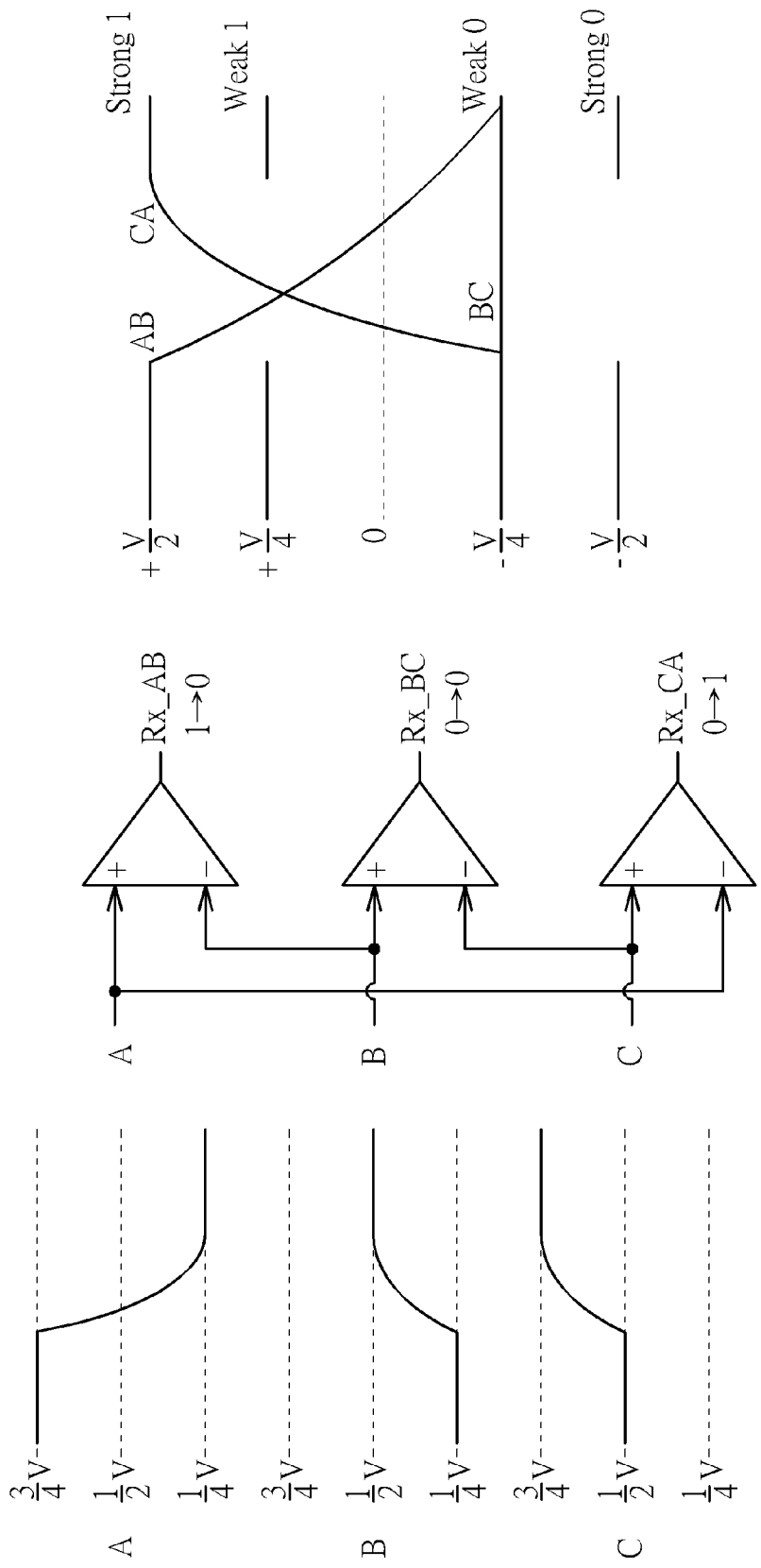
FIG. 28 is a diagram illustrating a sequence of "4" symbols (which are double-transition symbols) according to the MIPI C-PHY specification.

In addition, the test vector signals s [0]-s [m-1] received under the calibration mode should be properly set such that only two transitions happen between every adjacent states of the test vector signals s [0]-s [m-1]. In one embodiment, the TEC receiver 2300 receives the test vector signals s [0]-s [m-1] that are generated from a TEC transmitter (e.g., transmitter 114 shown in FIG. 1) according to a predetermined calibration pattern. Consider a case where the TEC receiver 2300 is used in an interface complying with a MIPI (Mobile Industry Processor Interface) C-PHY specification. The predetermined calibration pattern may be a worst skew pattern for inducing largest switching jitter. For example, the predetermined calibration pattern may be set by a sequence of "2" symbols (which are double-transition symbols) according to the MIPI C-PHY specification, as illustrated in FIG. 27. For another example, the predetermined calibration pattern may be set by a sequence of "4" symbols (which are double-transition symbols) according to the MIPI C-PHY specification, as illustrated in FIG. 28.

Assume that the test vector signals s [0]-s [m-1] include s [0], s [1] and s [2] (m=3). During a first calibration period, the test vector signals s [0]-s [2] are properly set such that only two transitions happen between every adjacent states of the test vector signals s [0] and s [1] and there is no transition happening in the test vector signal s [2], and the TDC 2602 is operative to obtain the measured time difference $TD_{0-1}$ (i.e., coding jitter) between s [0] and s [1] by using a single measurement result or an average of multiple measurement results. During a second calibration period, the test vector signals s [0]-s [2] are properly set such that only two transitions happen between every adjacent states of the test vector signals s [0] and s [2] and there is no transition happening in the test vector signal s [1], and the TDC 2602 is operative to obtain the measured time difference $TD_{0-2}$ (i.e., coding jitter) between s [0] and s [2] by using a single measurement result or an average of multiple measurement results. During a third calibration period, the test vector signals s [0]-s [2] are properly set such that only two transitions happen between every adjacent states of the test vector signals s [1] and s [2] and there is no transition happening in the test vector signal s [0], and the TDC 2602 is operative to obtain the measured time difference $TD_{1-2}$ (i.e., coding jitter) between s [1] and s [2] by using a single measurement result or an average of multiple measurement results. It should be noted that the measurement order of the time differences $TD_{0-1}, TD_{0-2}$ and $TD_{1-2}$ may be adjusted, depending upon actual design considerations.

As shown in FIG. 26, the TDC 2602 includes a plurality of multiplexers (MUXes) 2612, 2614 and a sampling circuit (e.g., a D-type flip flop circuit) 2616. The MUX 2612 selects delayed test vector signals (i.e., one of s [m-1]_D[n:0], s [m-2]_D[n:0] . . . s [0]_D[n:0]) of a first test vector signal (i.e., one of s [m-1], s [m-2] . . . s [0]), and outputs the selected delayed test vector signals to the sampling circuit 2616 (particularly, a data input node of the sampling circuit

Figure 29:
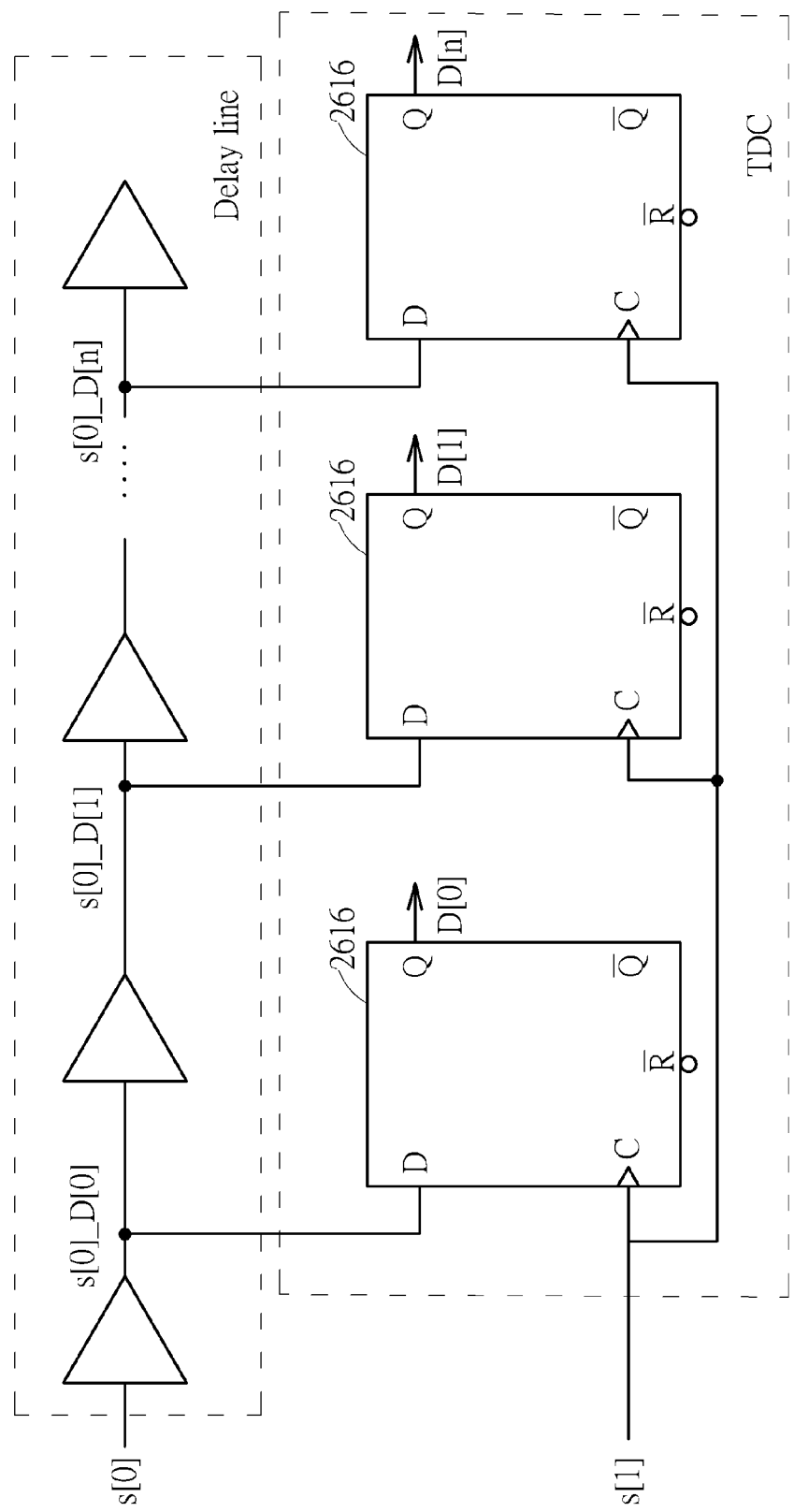
FIG. 29 is a diagram illustrating an example of a TDC and a delay line co-operating for achieving time-to-digital conversion according to an embodiment of the present invention.

2616). The MUX 2614 selects a second test vector signal (i.e., another of s [m-1], s [m-2] ... s [0]), and outputs the selected second test vector signal to the sampling circuit 2616 (particularly, a clock input node of the sampling circuit 2616). The sampling circuit 2616 measures a time difference between the first test vector signal and the second test vector signal by sampling the delayed test vector signals of the first test vector signal to generate a corresponding TDC code composed of sampled bits D[n:0] when triggered by the second test vector signal. FIG. 29 is a diagram illustrating an example of a TDC and a delay line co-operating for achieving time-to-digital conversion according to an embodiment of the present invention. Suppose that a time difference between a first test vector signal (e.g., s [0]) and a second test vector signal (e.g., s [1]) is required to be measured by the TDC 2602 during one calibration period, where the first test vector signal s [0] and the second test vector signal s [1] have transitions between every adjacent states during the calibration period. A delay line may include a plurality of delay cells cascaded in series, where each of the delay cells may provide one unit delay to the first test vector signal s [0]. Hence, delayed test vector signals s [0]_D[0], s [0]_D[1] ... s [0]_D[n] are generated from output nodes of the cascaded delay cells, respectively. A sampling circuit of a TDC may include a plurality of DFFs (D-type flip-flops), each having a plurality of input nodes (e.g., a data input node D, a clock input node C, and a reset input node $\overline{R}$) and a plurality of output nodes (e.g., a data output node Q and an inverted data output node $\overline{Q}$). The delayed test vector signals s [0]_D [0], s [0]_D[1] ... s [0]_D[n] are fed into data input nodes of the DFFs. In addition, the second test vector signal s [1] is fed into the clock input nodes of the DFFs, and sampled bits D[0]-D[n] are generated from the data output nodes of the DFFs.

Figure 30:
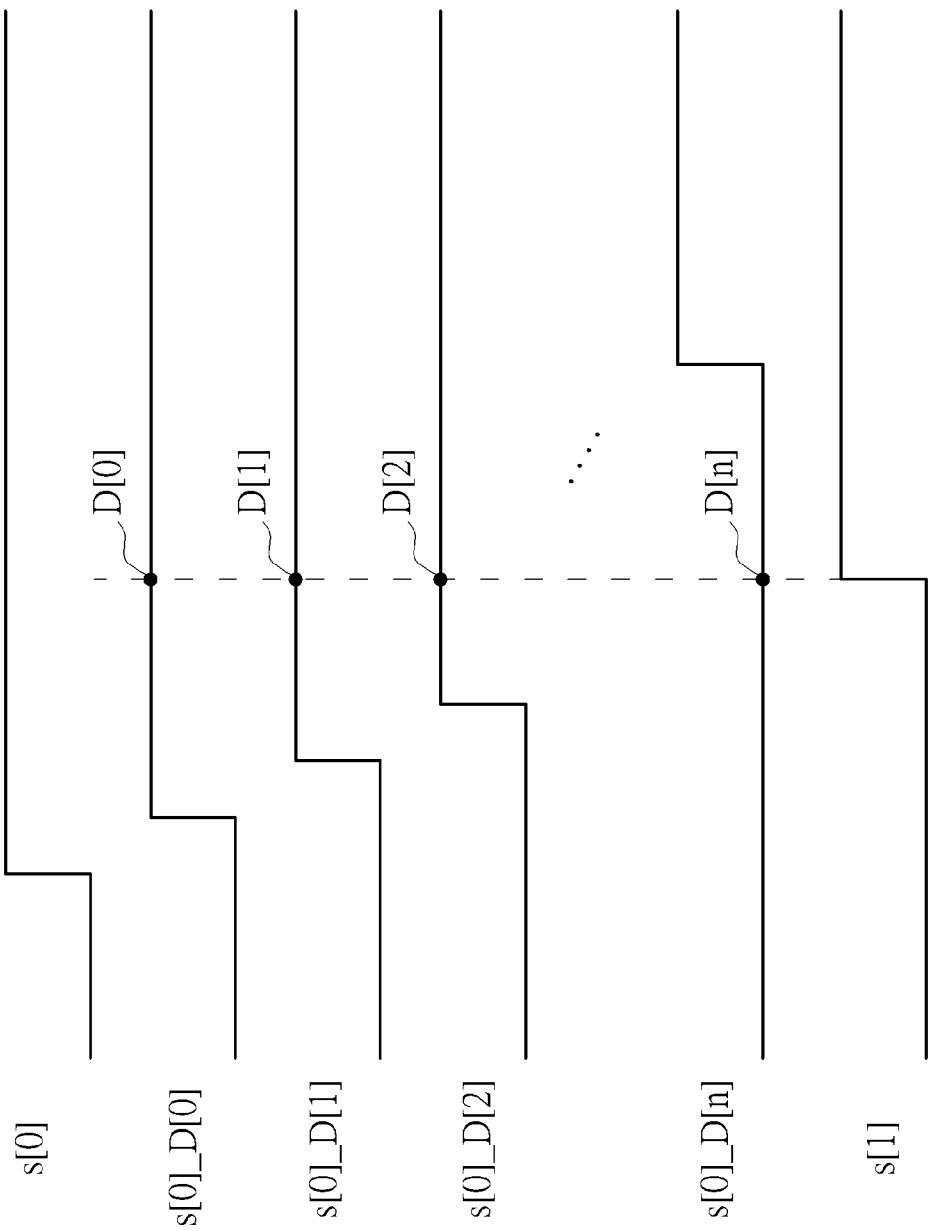
FIG. 30 is a diagram illustrating time-to-digital conversion performed for measuring a time different between two test vector signals according to an embodiment of the present invention.

FIG. 30 is a diagram illustrating time-to-digital conversion performed for measuring a time different between two test vector signals according to an embodiment of the present invention. When a transition of the second test vector signal s [1] occurs, the delayed test vector signals s [0]_D [0], s [0]_D [1] ... s [0]_D [n] are sampled to generate a TDC code composed of sampled bits D [0], D [1] ... D [n], where the number of 1's included in the TDC code indicates the time difference between the first test vector signal s [0] and the second test vector signal s [1]. With a proper selection made by the multiplexers 2612 and 2614, a time difference between any two of the test vector signals s [0]-s [m-1] can be obtained by using the TDC 2602.

After time differences associated with the test vector signals s [0]-s [m-1] are available to the calibration state machine 2604, the actual skew condition of the test vector signals s [0]-s [m-1] can be easily known. The calibration state machine 2604 refers to the actual skew condition of the test vector signals s [0]-s [m-1] and the delay time D required for setting the sampling timing TS to determine the calibrated delay setting DS that can be employed by the delay line circuit 2304 under the normal mode to achieve the CDR-less sampling timing setting as well as the vector signal de-skewing.

Ina second exemplary design, the delay line circuit 2304 shown in FIG. 23 may not be reused in the calibration mode to provide signals needed by the skew calibration performed by the skew calibration circuit 2302. When the TEC receiver 2300 operates in a normal mode, the delay line circuit 2304, the transmission detection circuit 404 and the data sampling circuit 406 are enabled, and the skew calibration circuit 2302 is disabled. When the TEC receiver 2300 operates in a calibration mode, the delay line circuit 2304, the transmission detection circuit 404 and the data sampling circuit 406 are disabled, and the skew calibration circuit 2302 is enabled. Hence, the delay line circuit 2304 is used in the normal mode only. To obtain the delayed signals needed by the skew calibration, the skew calibration circuit 2302 may be configured to have a replica delay line implemented therein.

Figure 31:
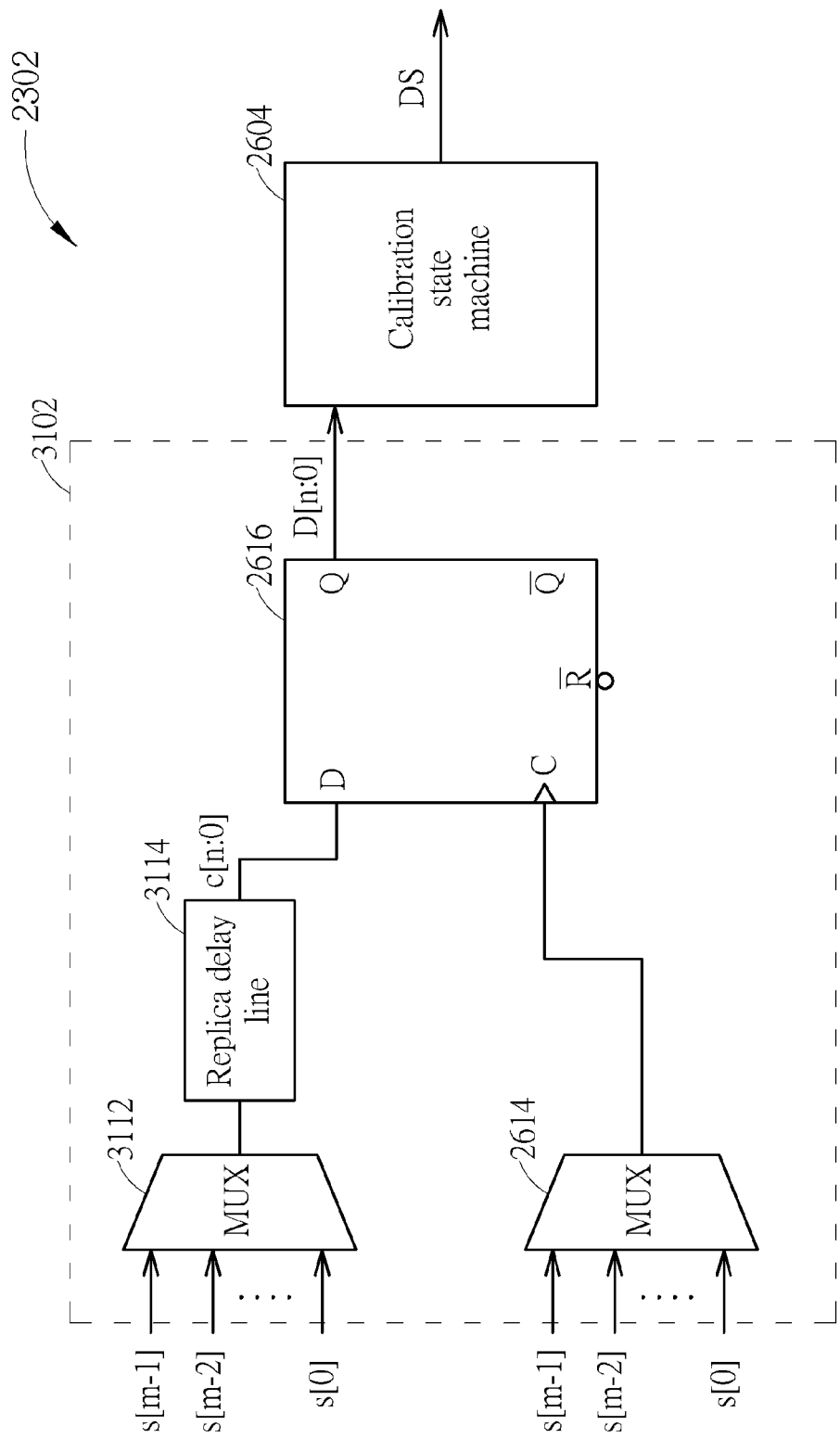
FIG. 31 is a diagram illustrating alternative circuit implementation of the skew calibration circuit shown in FIG. 23.

FIG. 31 is a diagram illustrating alternative circuit implementation of the skew calibration circuit 2302 shown in FIG. 23. The major difference between the circuit designs shown in FIGS. 26 and 31 is that the circuit design in FIG. 31 has one replica delay line 3114 coupled between a multiplexer 3112 and the sampling circuit 2616 of the TDC 3102. When the skew calibration circuit 2302 is realized by the alternative circuit implementation shown in FIG. 31, the delay line circuit 2304 may be implemented using the delay lines $2502_0$-$2502_{m-1}$ modified to operate in the normal mode only. Hence, the delay lines $2502_0$-$2502_{m-1}$ of the delay line circuit 2304 are not used to provide the delayed test vector signals s [0]_D [n:0]-s [m-1]_D [n:0] under the calibration mode. In this embodiment, the replica delay line 3114 in the TDC 3102 and the delay lines $2502_0$-$2502_{m-1}$ in the delay line circuit 2304 may be implemented using same delay lines. In addition, the replica delay line 3114 is configured to provide any of the delayed test vector signals s [0]_D [n:0]-s [m-1]_D [n:0] under the calibration mode. For example, when one of the test vector signals s [0]-s [m-1] is selected by the MUX 3112, the replica delay line 3114 delays the selected test vector signal to generate a plurality of delayed test vector signals c [n:0] having different delay times with respect to the selected test vector signal. For example, when the selected test vector signal is s [0], the delayed test vector signals c [n:0] are s [0]_D [n:0]; when the selected test vector signal is s [m-1], the delayed test vector signals c [n:0] are s [m-1]_D [n:0]; and when the selected test vector signal is s [m-2], the delayed test vector signals c [n:0] are s [m-2]_D [n:0]. With a proper selection made by the multiplexers 3112 and 2614, a time difference between any two of the test vector signals s [0]-s [m-1] can be obtained by using the TDC 3102 shown in FIG. 31.

Similarly, after time differences associated with the test vector signals s [0]-s [m-1] are available to the calibration state machine 2604, the actual skew condition of the test vector signals s [0]-s [m-1] can be easily known. The calibration state machine 2604 refers to the actual skew condition of the test vector signals s [0]-s [m-1] and the delay time D required for setting the sampling timing TS to determine the calibrated delay setting DS that can be employed by the delay line circuit 2304 under the normal mode to achieve the CDR-less sampling timing setting as well as the vector signal de-skewing.

With the calibrated delay setting DS properly set by the skew calibration circuit 2302 under a calibration mode, a delay line circuit employing the calibrated delay setting DS under a normal mode can also serve as a de-skew circuit for minimizing or cancelling skew of the vector signals received under the normal mode. The same invention concept may also be applied to other TEC receiver structures.

Figure 32:
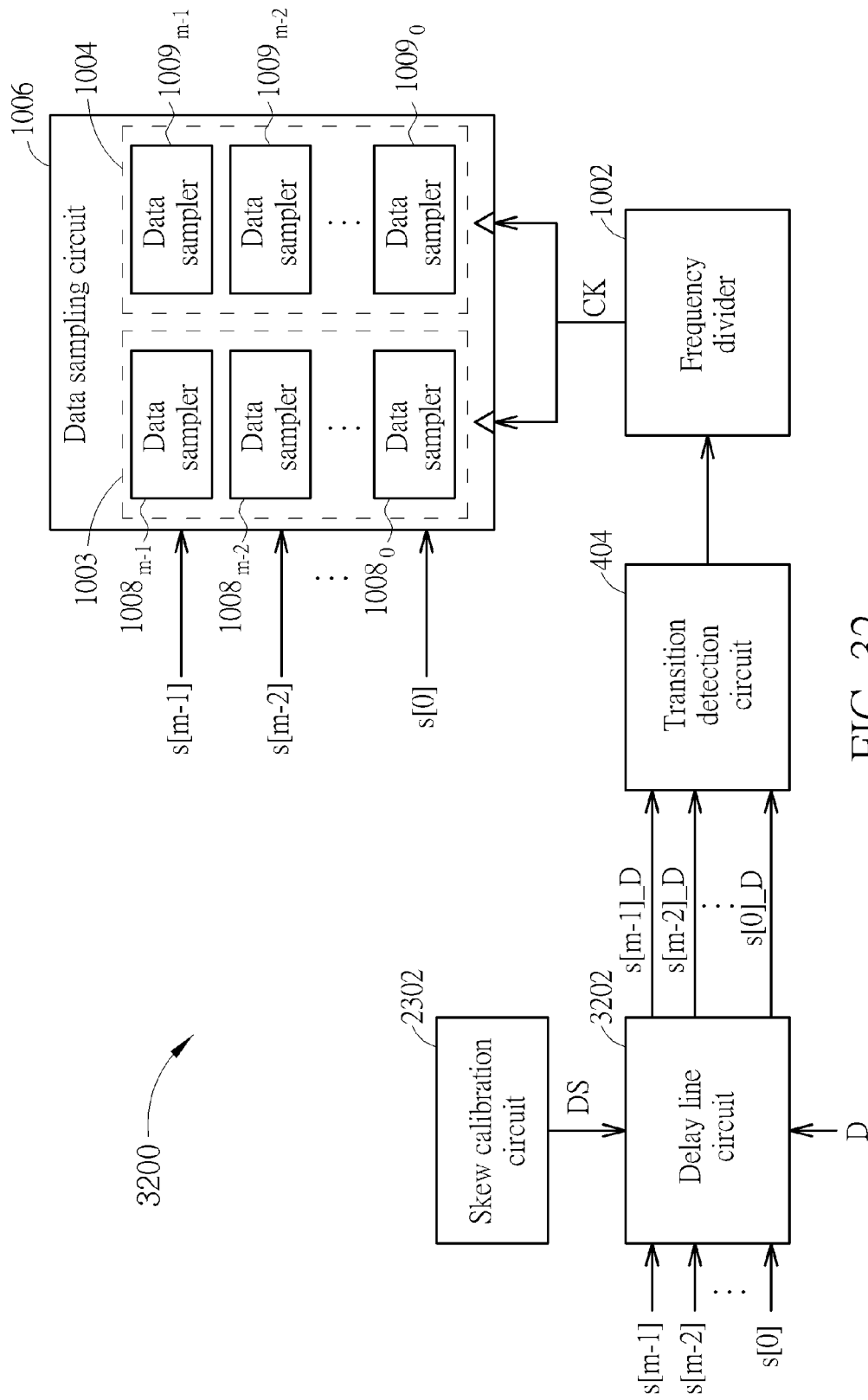
FIG. 32 is a diagram illustrating a TEC receiver with skew calibration according to a second embodiment of the present invention.

FIG. 32 is a diagram illustrating a TEC receiver with skew calibration according to a second embodiment of the present invention. The TEC receiver 3200 may be built by adding the proposed skew calibration circuit 2302 to the TEC receiver structure shown in FIG. 10, where the delay line circuit 3202 employs the calibrated delay setting DS under the normal mode to achieve the CDR-less sampling timing setting as well as the vector signal de-skewing.

In above embodiments, the calibration state machine 2604 refers to the actual skew condition of the test vector signals s [0]-s [m-1] and the delay time D required for setting the sampling timing TS to determine the calibrated delay setting DS that can be employed by a delay line circuit 2304/3202 under the normal mode to achieve the CDR-less sampling timing setting as well as the vector signal de-skewing. However, this is for illustrative purposes only, and is not meant to be a limitation of the present invention. Alternatively, the calibration state machine 2604 may refer to the actual skew condition of the test vector signals s [0]-s [m-1] to determine the calibrated delay setting DS that can be employed by a delay line circuit under the normal mode to achieve the vector signal de-skewing only. This alternative design also falls within the scope of the present invention.

Figure 33:
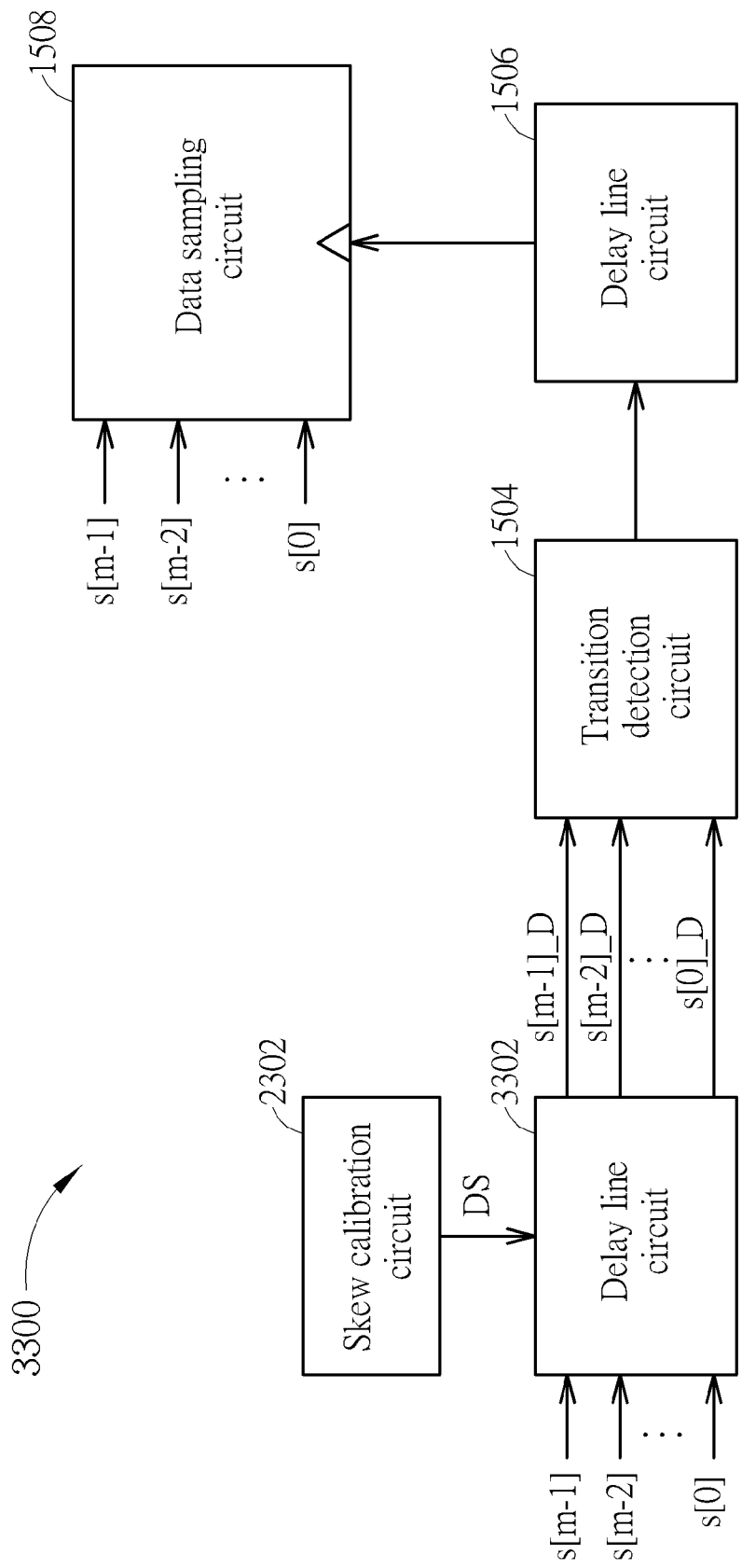
FIG. 33 is a diagram illustrating a TEC receiver with skew calibration according to a third embodiment of the present invention.

FIG. 33 is a diagram illustrating a TEC receiver with skew calibration according to a third embodiment of the present invention. The TEC receiver 3300 may be built by adding the proposed skew calibration circuit 2302 to the TEC receiver structure shown in FIG. 15, where the delay line circuit 3302 employs the calibrated delay setting DS under the normal mode to achieve the vector signal de-skewing for following transition detection.

Figure 34:
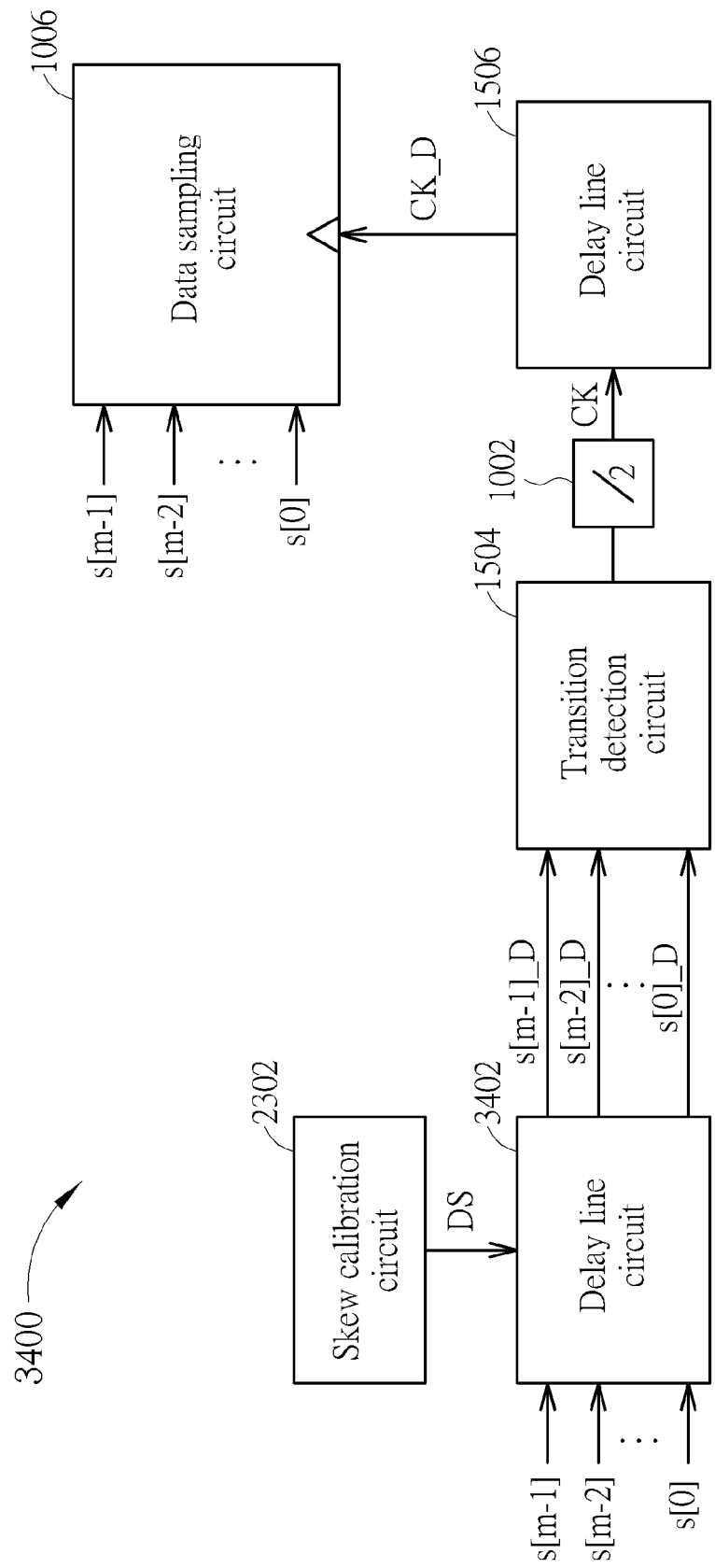
FIG. 34 is a diagram illustrating a TEC receiver with skew calibration according to a fourth embodiment of the present invention.

FIG. 34 is a diagram illustrating a TEC receiver with skew calibration according to a fourth embodiment of the present invention. The TEC receiver 3400 may be built by adding the proposed skew calibration circuit 2302 to the TEC receiver structure shown in FIG. 16, where the delay line circuit 3402 employs the calibrated delay setting DS under the normal mode to achieve the vector signal de-skewing for following transition detection.

Figure 35:
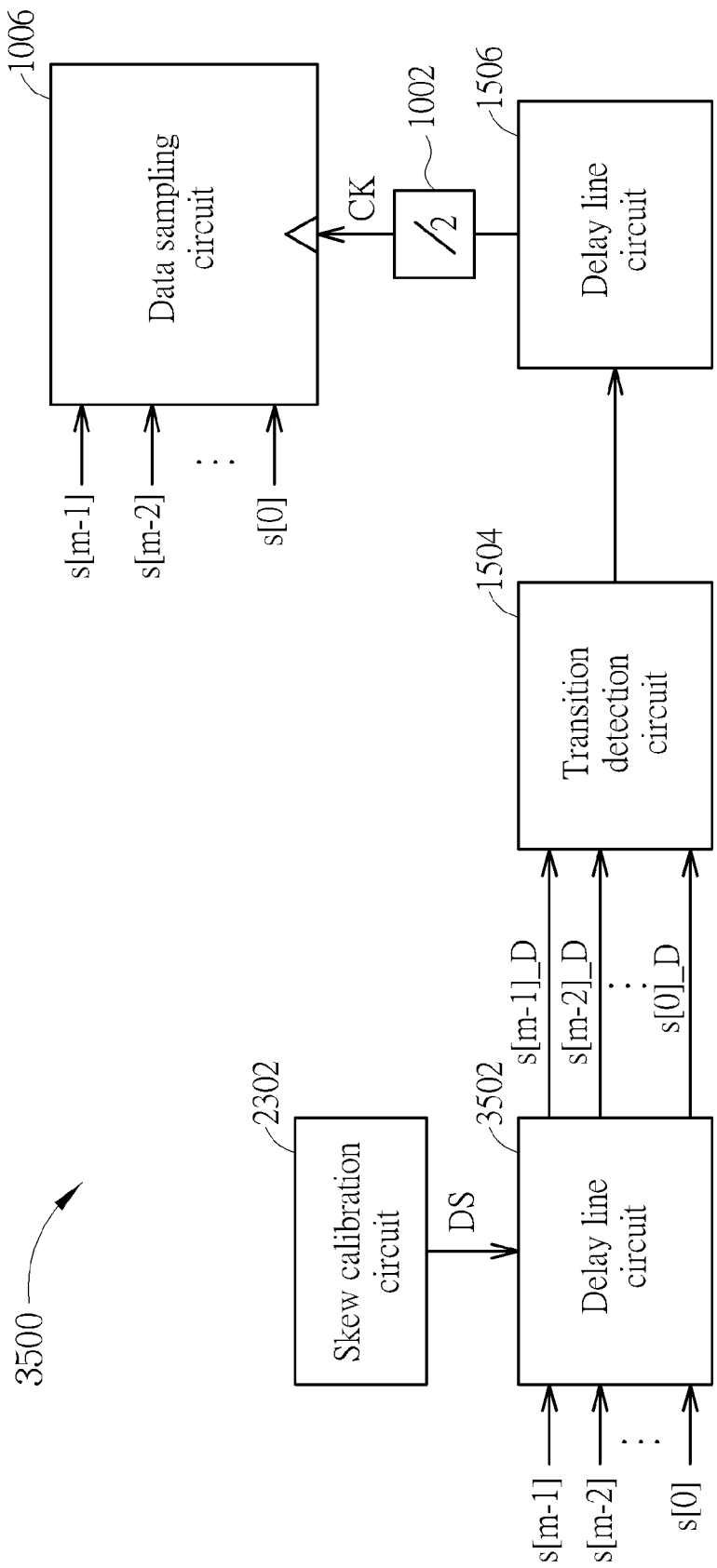
FIG. 35 is a diagram illustrating a TEC receiver with skew calibration according to a fifth embodiment of the present invention.

FIG. 35 is a diagram illustrating a TEC receiver with skew calibration according to a fifth embodiment of the present invention. The TEC receiver 3500 may be built by adding the proposed skew calibration circuit 2302 to the TEC receiver structure shown in FIG. 17, where the delay line circuit 3502 employs the calibrated delay setting DS under the normal mode to achieve the vector signal de-skewing for following transition detection.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A transition enforcing coding (TEC) receiver comprising:
   a delay line circuit, configured to employ a calibrated delay setting to delay a plurality of vector signals to generate a plurality of delayed vector signals under a normal mode, respectively;
   a transition detection circuit, configured to detect a transition of at least one specific delayed vector signal among the delayed vector signals;
   a data sampling circuit, configured to sample the vector signals according to a sampling timing, wherein the sampling timing is determined based on an output of the transition detection circuit; and
   a skew calibration circuit, configured to set the calibrated delay setting under a calibration mode, wherein transition skew between different delayed vector signals is reduced by the calibrated delay setting under the normal mode.

2. The TEC receiver of claim 1, wherein the TEC receiver determines the sampling timing without using clock and data recovery (CDR).

3. The TEC receiver of claim 1, wherein the calibrated delay setting comprises different delay times, and the delay line circuit applies the different delay times to the different vector signals, respectively.

4. The TEC receiver of claim 1, wherein the skew calibration circuit comprises:
   a time-to-digital converter (TDC), configured to measure a plurality of time differences, each between two of a plurality of test vector signals under the calibration mode; and
   a calibration state machine, configured to determine the calibrated delay setting according to the time differences measured by the TDC.

5. The TEC receiver of claim 4, wherein the delay line circuit is reused in the calibration mode to delay each of the test vector signals to generate a plurality of delayed test vector signals having different delay times with respect to the test vector signal, and the TDC measures a time difference between a first test vector signal and a second test vector signal by sampling delayed test vector signals of the first test vector signal when triggered by the second test vector signal.

6. The TEC receiver of claim 4, wherein the skew calibration circuit further comprises:
   a delay line, configured to delay each of the test vector signals to generate a plurality of delayed test vector signals having different delay times with respect to the test vector signal;
   the TDC measures a time difference between a first test vector signal and a second test vector signal by sampling delayed test vector signals of the first test vector signal when triggered by the second test vector signal.

7. TEC receiver of claim 4, wherein only two transitions happen between every adjacent states of the test vector signals.

8. The TEC receiver of claim 4, wherein the TEC receiver receives the test vector signals that are generated from a TEC transmitter according to a predetermined calibration pattern.

9. The TEC receiver of claim 8, wherein the predetermined calibration pattern is set by a sequence of "2" symbols according to a MIPI (Mobile Industry Processor Interface) C-PHY specification.

10. The TEC receiver of claim 8, wherein the predetermined calibration pattern is set by a sequence of "4" symbols according to a MIPI (Mobile Industry Processor Interface) C-PHY specification.

11. A receiving method applied to transition enforcing coding (TEC) comprising:
   performing skew calibration to set a calibrated delay setting under a calibration mode;
   delaying a plurality of vector signals according to the calibrated delay setting to generate a plurality of delayed vector signals under a normal mode, respectively, wherein transition skew between different delayed vector signals is reduced by the calibrated delay setting under the normal mode;
   detecting a transition of at least one specific delayed vector signal among the delayed vector signals to generate a transition detection output; and
   sampling the vector signals according to a sampling timing, wherein the sampling timing is determined based on the transition detection output.

12. The receiving method of claim 11, wherein the sampling timing is determined without using clock and data recovery (CDR).

13. The receiving method of claim 11, wherein the calibrated delay setting comprises different delay times, and the different delay times are applied to the different vector signals, respectively.

14. The receiving method of claim 11, wherein the skew calibration comprises:
- performing a time-to-digital conversion to measure a plurality of time differences, each between two of a plurality of test vector signals under the calibration mode; and
- determining the calibrated delay setting according to the time differences measured by the time-to-digital conversion.

15. The receiving method of claim 14, wherein the delayed vector signals are generated from a delay line circuit by delaying the vector signals according to the calibrated delay setting under the normal mode; the receiving method further comprises:
- reusing the delay line circuit in the calibration mode to delay each of the test vector signals to generate a plurality of delayed test vector signals having different delay times with respect to the test vector signal; and
- performing the time-to-digital conversion to measure the time differences comprises:
- measuring a time difference between a first test vector signal and a second test vector signal by sampling delayed test vector signals of the first test vector signal when triggered by the second test vector signal.

16. The receiving method of claim 14, wherein the skew calibration further comprises:
- delaying each of the test vector signals to generate a plurality of delayed test vector signals having different delay times with respect to the test vector signal; and
- performing the time-to-digital conversion to measure the time differences comprises:
- measuring a time difference between a first test vector signal and a second test vector signal by sampling delayed test vector signals of the first test vector signal when triggered by the second test vector signal.

17. The receiving method of claim 14, wherein only two transitions happen between every adjacent states of the test vector signals.

18. The receiving method of claim 14, wherein the test vector signals are generated from a TEC transmitter according to a predetermined calibration pattern.

19. The receiving method of claim 18, wherein the predetermined calibration pattern is set by a sequence of "2" symbols according to a MIPI (Mobile Industry Processor Interface) C-PHY specification.

20. The receiving method of claim 18, wherein the predetermined calibration pattern is set by a sequence of "4" symbols according to a MIPI (Mobile Industry Processor Interface) C-PHY specification.

* * * * *